(12) United States Patent
Murakami et al.

(10) Patent No.: US 7,491,562 B2
(45) Date of Patent: Feb. 17, 2009

(54) LIGHT EMITTING DEVICE AND MANUFACTURING METHOD THEREOF

(75) Inventors: Satoshi Murakami, Tochigi (JP); Noriko Miyagi, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/896,822

(22) Filed: Sep. 6, 2007

(65) Prior Publication Data
US 2008/0032430 A1     Feb. 7, 2008

Related U.S. Application Data

(62) Division of application No. 10/731,033, filed on Dec. 10, 2003, now Pat. No. 7,282,736.

(30) Foreign Application Priority Data
Dec. 10, 2002   (JP) .............................. 2002-357550

(51) Int. Cl.
    *H01L 21/20*     (2006.01)
(52) U.S. Cl. .................. 438/30; 438/149; 438/151; 438/166; 257/E21.413; 257/E27.111; 257/E29.29; 257/E29.293
(58) Field of Classification Search ................ 438/30, 438/149, 151, 162, 166; 257/E21.413, E27.111, 257/E29.29, 293
    See application file for complete search history.

(56) References Cited

U.S. PATENT DOCUMENTS

| | | | |
|---|---|---|---|
| 4,769,686 A | 9/1988 | Horiuchi et al. | |
| 5,652,667 A | 7/1997 | Kurogane | |
| 5,757,054 A | 5/1998 | Miyawaki et al. | |
| 5,767,827 A | 6/1998 | Kobayashi et al. | |
| 5,933,204 A | 8/1999 | Fukumoto | |
| 6,049,132 A | 4/2000 | Iwahashi et al. | |

(Continued)

FOREIGN PATENT DOCUMENTS

EP     1 096 303 A2     5/2001

(Continued)

OTHER PUBLICATIONS

International Search Report Dated Feb. 3, 2004 for PCT/JP03/15173.

(Continued)

*Primary Examiner*—Michael S Lebentritt
(74) *Attorney, Agent, or Firm*—Nixon Peabody LLP; Jeffrey L. Costellia

(57) ABSTRACT

In a light emitting device, it is preferable that a surface of a film below a light-emitting element has flatness. Therefore, treatment such as planarization of a surface of a film is performed after forming the film. The present invention proposes a structure of a light-emitting device that can make the foregoing planarization easier. The same layer as a wiring formed on a first film is used to manufacture a second film. Herewith, a portion of the first film below a light-emitting element can be prevented from being etched to form unevenness at a surface of the first film during the formation of the wiring. In addition, a surface of a third film is made higher by providing the second film to enable local planarization.

10 Claims, 15 Drawing Sheets

U.S. PATENT DOCUMENTS

| | | | |
|---|---|---|---|
| 6,252,249 B1 * | 6/2001 | Yamazaki | 257/66 |
| 6,384,427 B1 | 5/2002 | Yamazaki et al. | |
| 6,400,426 B1 * | 6/2002 | Yamazaki et al. | 349/43 |
| 6,556,264 B1 | 4/2003 | Hirakata et al. | |
| 6,559,594 B2 | 5/2003 | Fukunaga et al. | |
| 6,593,990 B1 * | 7/2003 | Yamazaki | 349/138 |
| 6,608,449 B2 | 8/2003 | Fukunaga | |
| 6,670,637 B2 | 12/2003 | Yamazaki et al. | |
| 6,828,725 B2 | 12/2004 | Kimuri | |
| 7,061,186 B2 | 6/2006 | Inukai et al. | |
| 7,183,582 B2 * | 2/2007 | Imamura | 257/88 |
| 7,301,279 B2 * | 11/2007 | Sakakura et al. | 313/509 |
| 7,365,494 B2 * | 4/2008 | Sato | 315/169.3 |
| 7,402,948 B2 * | 7/2008 | Yamazaki et al. | 313/506 |
| 7,427,834 B2 * | 9/2008 | Yamazaki | 313/506 |
| 2001/0053559 A1 | 12/2001 | Nagao et al. | |
| 2002/0011799 A1 | 1/2002 | Kimura | |
| 2002/0021266 A1 | 2/2002 | Koyama et al. | |
| 2002/0038998 A1 | 4/2002 | Fujita et al. | |
| 2002/0047120 A1 | 4/2002 | Inukai | |
| 2002/0047555 A1 | 4/2002 | Inukai | |
| 2002/0080303 A1 | 6/2002 | Izumi | |
| 2002/0121860 A1 | 9/2002 | Seo et al. | |
| 2002/0134979 A1 | 9/2002 | Yamazaki et al. | |
| 2003/0034497 A1 | 2/2003 | Yamazaki et al. | |
| 2003/0052597 A1 | 3/2003 | Sakurai | |
| 2003/0057422 A1 | 3/2003 | Yamazaki et al. | |
| 2003/0058210 A1 | 3/2003 | Yamazaki et al. | |
| 2003/0062826 A1 | 4/2003 | Seo et al. | |
| 2003/0222334 A1 | 12/2003 | Ikeda et al. | |
| 2004/0256979 A1 | 12/2004 | Murakami et al. | |

FOREIGN PATENT DOCUMENTS

| | | |
|---|---|---|
| JP | 2000-077191 | 3/2000 |
| JP | 2001-043980 | 2/2001 |
| JP | 2001-077191 | 3/2001 |
| JP | 2001-195015 | 7/2001 |
| JP | 2001-284342 | 10/2001 |
| JP | 2002-108250 | 4/2002 |
| JP | 2002-351355 | 12/2002 |
| JP | 2002-353466 | 12/2002 |
| JP | 2003-086356 | 3/2003 |
| JP | 2003-345267 | 12/2003 |

OTHER PUBLICATIONS

International Preliminary Examination Dated Mar. 23, 2004, of PCT/JP03/15173.

* cited by examiner

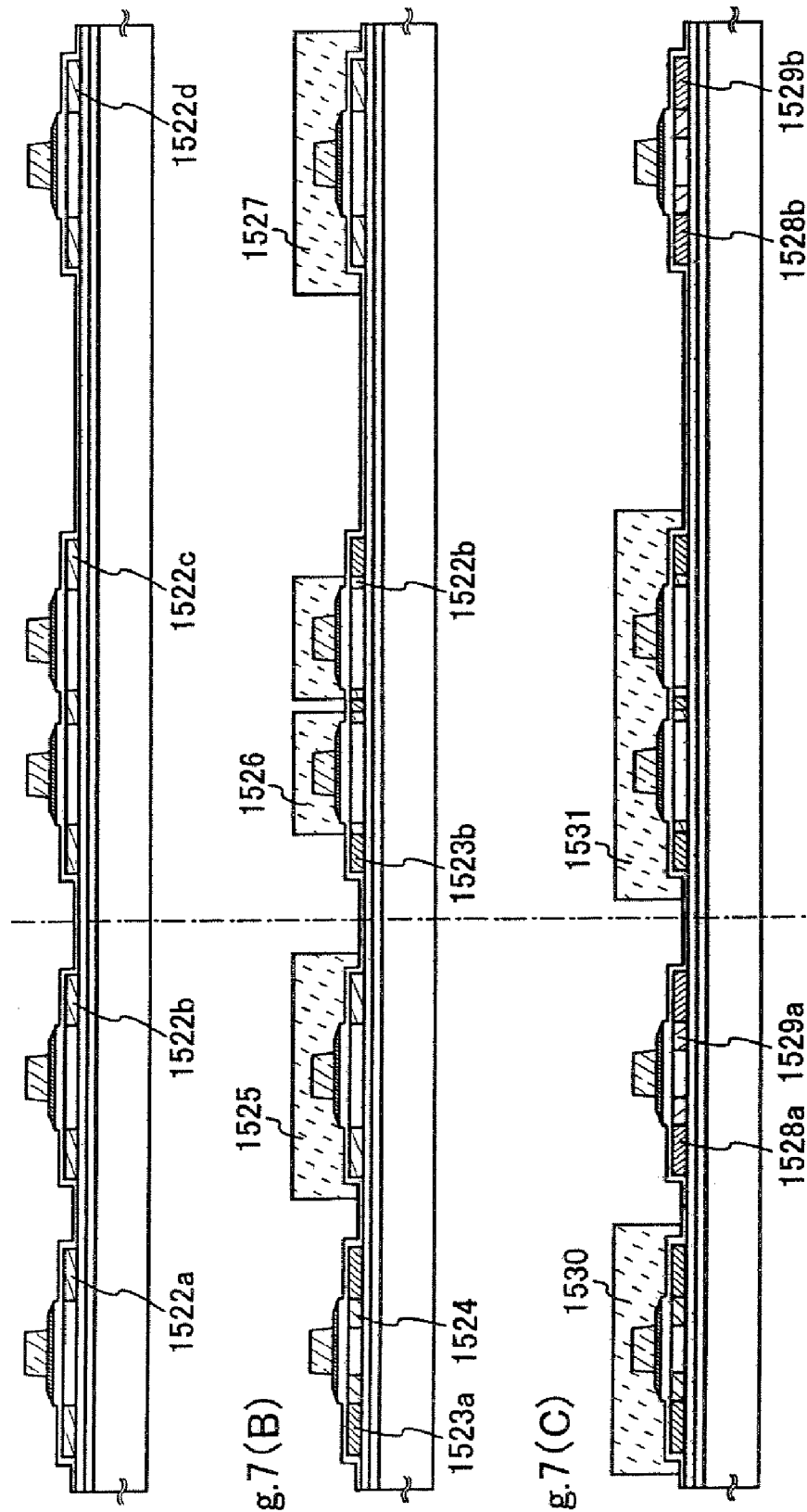

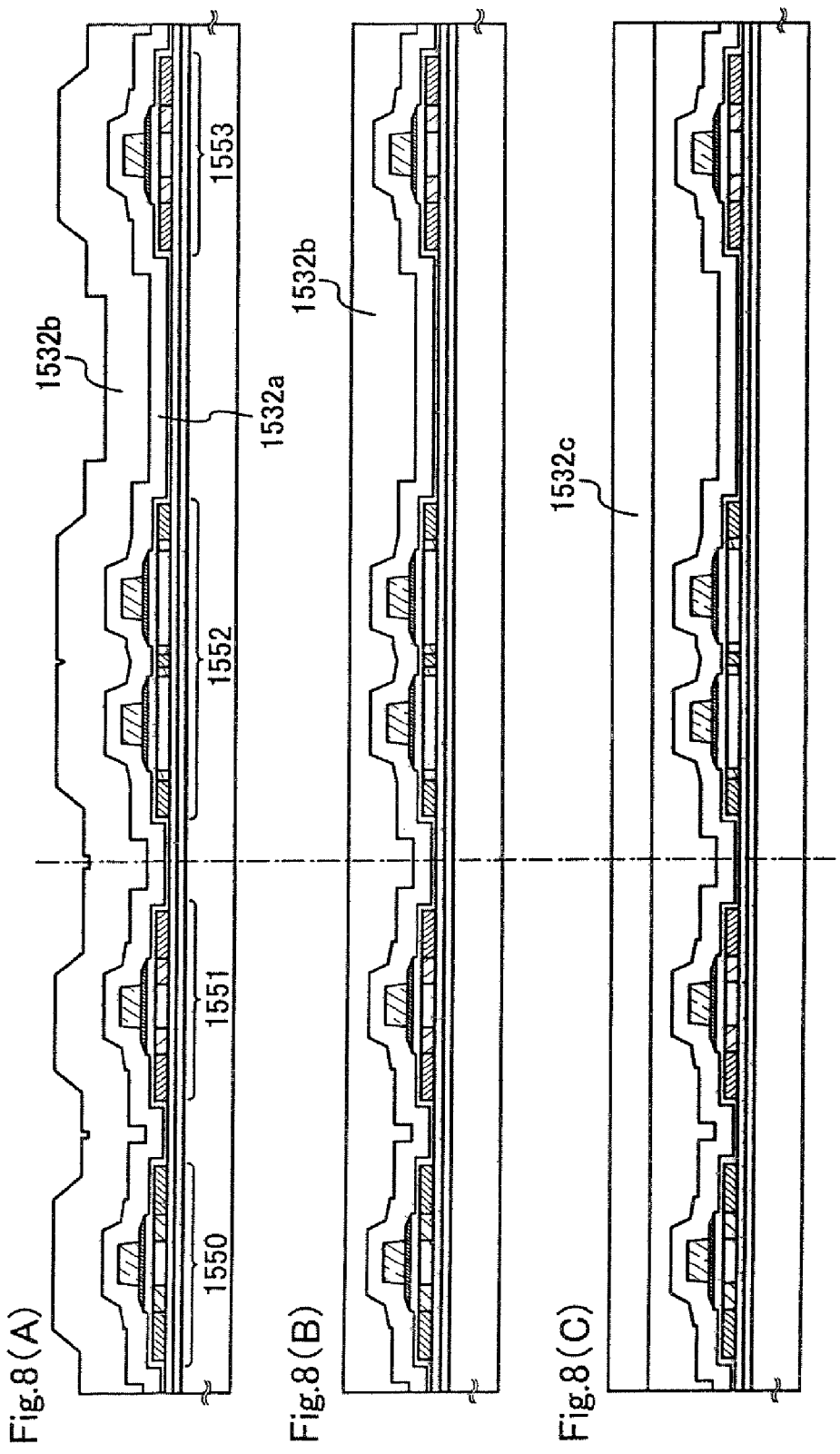

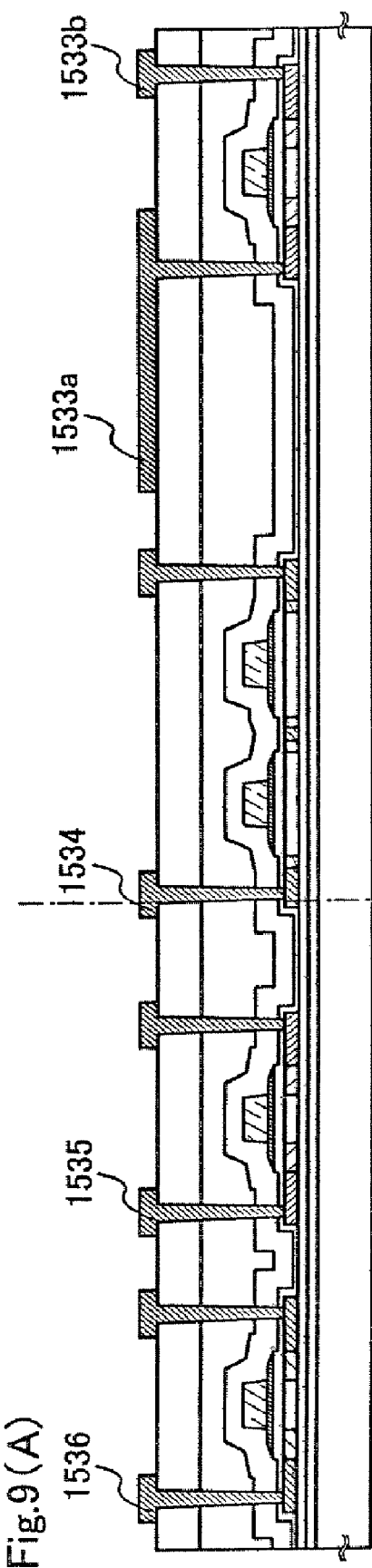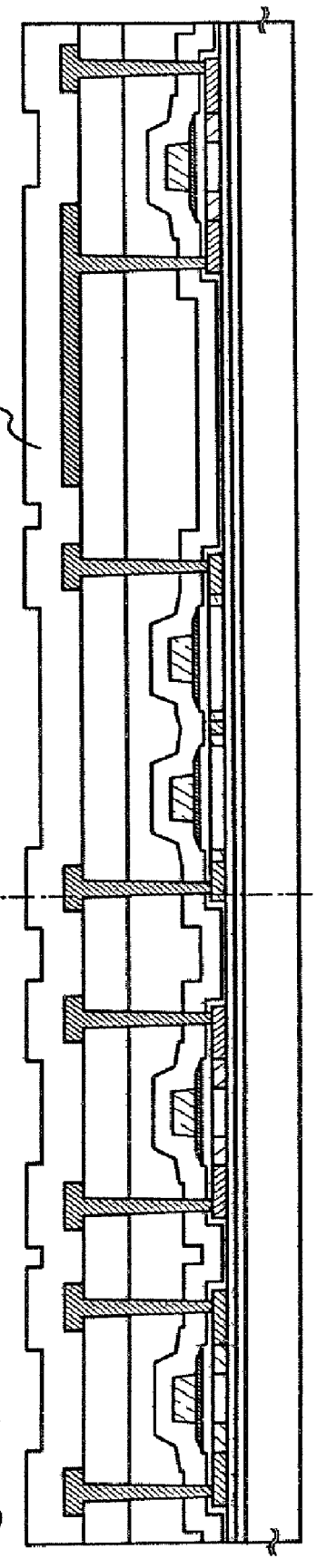

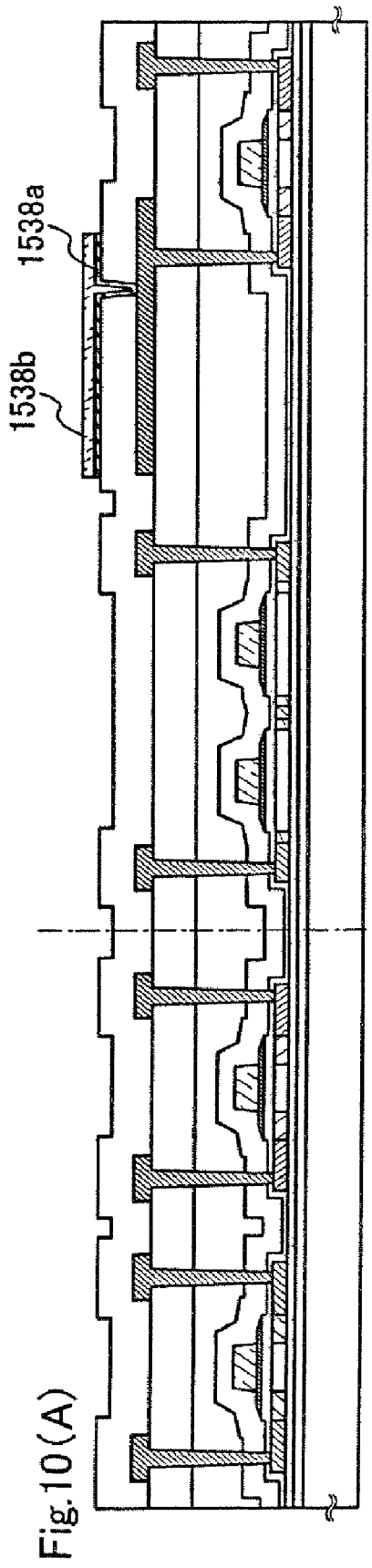
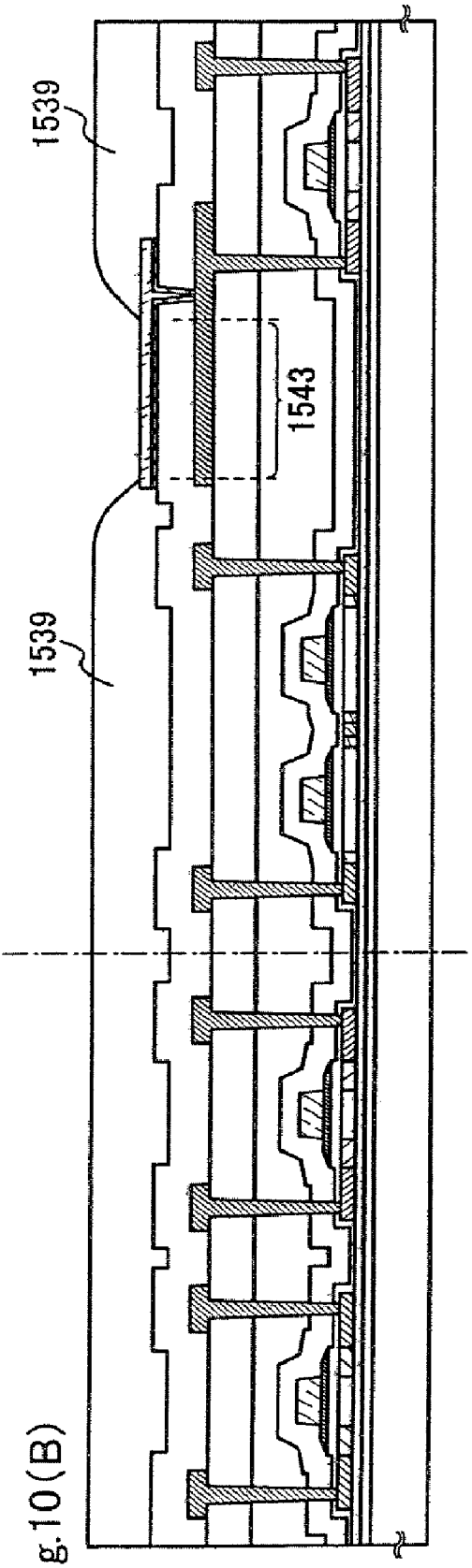

LIGHT EMITTING DEVICE AND MANUFACTURING METHOD THEREOF

This application is a Divisional of application Ser. No. 10/731,033 filed Dec. 10, 2003, now Allowed.

TECHNICAL FIELD

The present invention relates to a light-emitting device and a manufacturing method thereof, in particular, to a light-emitting device to which a structure that makes a planarization process easier is applied and a manufacturing method thereof.

BACKGROUND ART

Attention is paid to development of an EL display using an electroluminescence (Electro Luminescence; hereinafter, abbreviated to "EL") element that is a light-emitting element that has characteristics such as self-light emission, wide viewing angle, high-speed response, low voltage drive, and low power consumption.

An EL display is classified into a passive matrix type or an active matrix type depending on a driving method of an EL element.

In an active matrix EL display, a thin film transistor (Thin Film Transistor; hereinafter, abbreviated to "TFT") is used for driving an EL element, and generally, after forming on a substrate a driver circuit comprising a TFT, and the like, an EL element is further formed thereover.

As an active matrix EL display, for example, a display that has a structure of an anode provided on a planarizing insulating film and a source electrode of a TFT connected to the anode of an organic EL element through a contact hole provided in the planarizing insulating film has been proposed (see Patent Document 1, for example).

As a method of forming a planarizing insulating film, a method of forming a film that has self-planarization such as an organic resin film for planarization can be given as a quite simple method.

However, many of films that have self-planarization such as an organic resin film have low heat resistance. In addition, there is fear that gas is generated from the film after forming the film to cause degradation of an EL element since the film includes a volatile solvent. It is generally possible to suppress such degradation of an EL element due to gas generated from the film by performing appropriate treatment.

On the other hand, instead of the organic resin film mentioned above, an inorganic insulating film with high heat resistance from which gas is unlikely to be generated may be used for fear of generation of gas.

However, it is often the case that many of insulating films from which no gas is generated have no self-planarization. Therefore, a step generated due to a difference between laminated structures forming respective portions on a TFT array substrate is reflected with the result that the insulating film has an uneven surface. In the case of forming an electrode of an EL element on the uneven insulating film, electric field becomes concentrated at an edge, which can cause acceleration of degradation of the EL element. In addition, unevenness generated due to surface roughness generated on the insulating film cannot be completely covered with a light-emitting layer with the result that an anode and a cathode of a light-emitting element sometimes short out. Therefore, measures such as planarization of an interlayer insulating film by CMP (Chemical Mechanical Polishing) or the like is applied.

Patent Document 1: Japanese Patent Laid-Open 2000-77191 (pages 2 to 4, FIG. 1)

DISCLOSURE OF INVENTION (Problem to be Solved by the Invention)

However, in the case of using a planarizing method for first removing a portion that is the highest from a base level such as CMP to have an insulating film planarized, it is necessary to form the insulating film in consideration of an amount to be polished and the like in order also for a portion where accumulated film thicknesses of respective layers is the largest to have the insulating film left. Therefore, as the difference is larger between a portion where accumulated film thicknesses of respective portions on a TFT array substrate is the largest (that is, a portion that is the highest from a base level) and a portion where accumulated film thicknesses of respective portions on the TFT array substrate is the smallest (that is, a portion that is the lowest from the base level), the insulating film is required to have a thicker film thickness, and deposition over the performance of a deposition system may be required. In addition, as the foregoing difference in accumulated film thicknesses is larger, an amount to be polished of the insulating film is increased. Therefore, the difference in amount to be polished (not a relative value but an absolute value) between a portion at a fast polishing rate and a portion at a slow polishing rate becomes larger, which has a problem of a large influence of fluctuation in polishing rate.

In view of the problem above, it is an object of the present invention to provide a light-emitting device that has a structure that makes it possible to reduce a film thickness to be deposited and an amount to be polished in a planarizing process to make planarization easier, and a manufacturing method thereof.

(Means for Solving the Problem)

A light-emitting device according to the present invention is characterized in that, by providing on a first film a second film formed of the same layer as a wiring, planarization of a surface of a third film is made easier.

It is preferable that the first film is a film that has self-planarization or a film that has a surface planarized.

By providing the second film, a surface of the first film can be prevented from becoming rough due to over-etching of the wiring and forming unevenness at the surface of the first film.

Therefore, planarization of the surface of the third film becomes unnecessary as long as unevenness that causes a defect in a light-emitting element is not formed at the surface of the second film or at the surface of the third film above the second film in a process of forming the second film and the subsequent processes.

In addition, even in the case where unevenness is formed at the surface of the second film and therefore planarization of the surface of the third film is necessary, the planarization of the third film is made easier by making the second film have a film thickness equal to or thicker than that of the wiring.

This is because the surface of the third film has a height increased by providing the second film to enable local planarization of the surface of the third film in an overlapping portion of the second film and the third film.

This regard will be described with reference to FIGS. 2(A) and (B). In FIGS. 2(A) and (B), a film 302 is formed on a film 301. In addition, a film 303 is formed to cover the film 301 and the film 302. At the surfaces of the film 301 and the film 302, micro unevenness that is much smaller than a film thickness of the film 302 is formed. Due to this effect, micro unevenness is formed at a surface of the film 303. In contrast with the foregoing micro unevenness, unevenness due to a step generated by the film 302 is referred to as macro unevenness. In addition, due to the film 302, there are a portion that is higher from a base level to the surface of the film 303 and a portion that is lower. It is assumed that the portion that has the higher height from the base level (The surface of the film 301 is assumed to be the base level) to the surface of the film 303 is referred to as a region A and the portion that has the lower height is referred to as a region B.

Now, the case of planarizing only the film 303 in the region A by polishing for first removing a surface of a convex portion will be compared to the case of planarizing the film 303 in the region B by the polishing.

In the case of planarizing the film 303 in the region A, planarization of a step of the film 303 between the region A and the region B (that is, macro unevenness) is unnecessary. Therefore, the film 303 should be formed in consideration of at least a film thickness to be left and a film thickness to be reduced by the planarization, of the film 303 in the region A. On the other hand, in the case of planarizing the film 303 in the region B, the film 303 in the region A is required to be polished in order for the surface of the film 303 in the region B to be the highest from the base level (that is, in order to reach a surface to be polished), and planarization is required to be conducted in order to remove the step of the film 303 between the region A and the region B. Therefore, it is understandable that a film thickness to be deposited and an amount to be polished both concerning planarization are more reduced and planarization is easier in the case of locally planarizing only the film 303 in the region A than in the case of fully planarizing the film in the region B.

Therefore, by providing the second film below at least a portion of the surface of the third film, which is required to have flatness, the portion can be locally planarized.

In addition, unevenness that is likely to cause a defect in a light-emitting element is covered with a fourth film that has an opening provided. Therefore, at least a portion of the surface of the third film, which is overlapped with an electrode of a light-emitting element in the opening of the fourth film, is planarized.

The second film may be a single layer or a multilayer film of two or more films.

In the present invention, the second film may be any film of a conductive film, an insulating film, a transparent film, a non-transparent film, and the like as long as a defect in a TFT or a light-emitting layer is not caused by diffusion or the like.

In addition, the second film may be integrated with the wiring.

In the case where the second film is a non-transparent film, this is used as a reflective film, and light is taken from the above of a substrate. Alternatively, an electrode of a light-emitting element may be formed of a film that has a favorable reflectivity or an electrode of a light-emitting element may be formed of a film of two or more films to provide a reflective film, in order to take light from the above of a substrate.

(Effect of the Invention)

By applying the present invention, a film thickness to be deposited and an amount to be polished in a planarizing process are reduced to make the planarizing process easier. In the result, generation of trouble in the planarizing process is reduced and the yield is improved in producing. The foregoing effect that the planarizing process is made easier is effective particularly in the case of using a large-sized substrate to produce a display. Additionally, a light extraction efficiency is improved by providing a reflective film for a pixel electrode or using a film for making a surface of a second interlayer insulating film higher as a reflective film, which is provided to make planarization easier. Therefore, the present invention also has an effect that power consumption can be reduced, a sharp image can be obtained, or the like.

BRIEF DESCRIPTION OF DRAWINGS

FIGS. 7A-7C are sectional views of processes describing the method of manufacturing the light-emitting device according to the present invention.

FIGS. 8A-8C are sectional views of processes describing the method of manufacturing the light-emitting device according to the present invention.

FIGS. 9A-9B are sectional views of processes describing the method of manufacturing the light-emitting device according to the present invention.

FIGS. 10A-10B are sectional views of processes describing the method of manufacturing the light-emitting device according to the present invention.

BEST MODE FOR CARRYING OUT THE INVENTION

EMBODIMENT MODE 1

A light-emitting device according to the present invention will be described with reference to FIG. 1.

Figure 1:
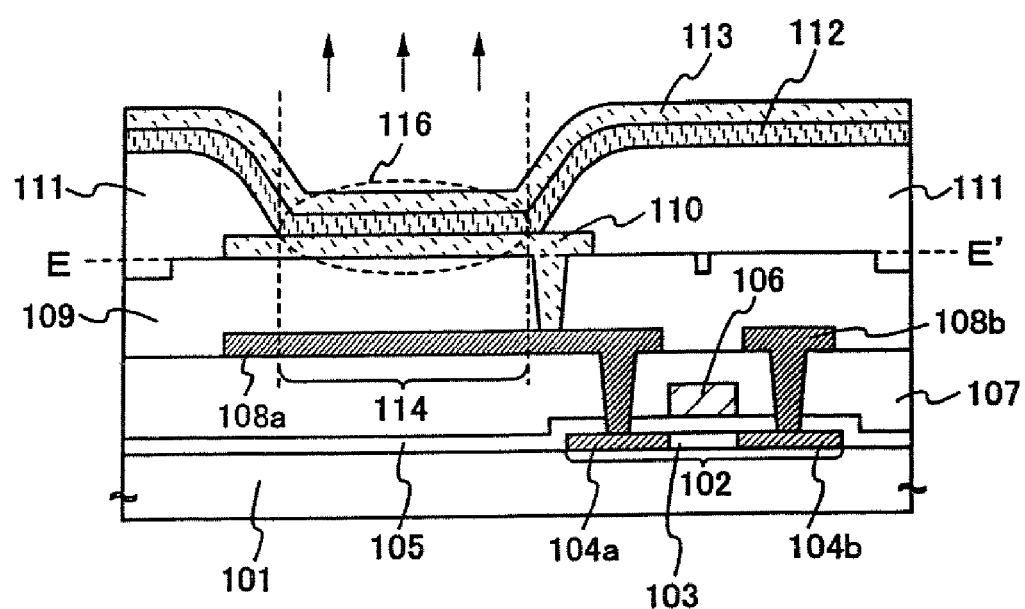
FIG. 1 is a sectional view describing a light-emitting device according to the present invention.
Figure 2:
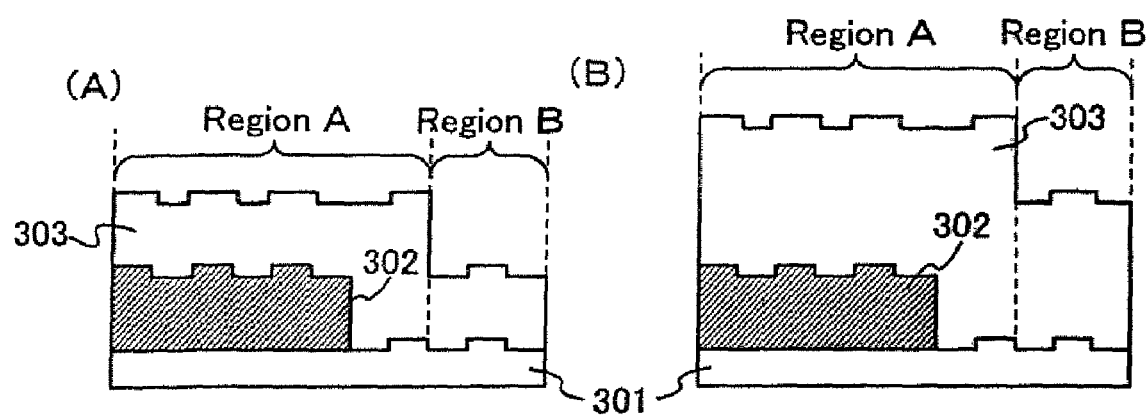
FIGS. 2A-2B are a sectional view describing the present invention.

FIG. 1 is a sectional view of a light-emitting device according to the present invention. In FIG. 1, a TFT 102 for driving a light-emitting element comprising a semiconductor film that has a source (or a drain) 104a and 104b, a gate insulating film 105, and a gate electrode (a gate wiring) 106 is formed on a substrate 101. The source (or the drain) 104a of the TFT for driving the light-emitting element is connected to a wiring 108a through a contact hole provided in a first interlayer insulating film 107. The first interlayer insulating film has a surface wholly planarized.

A second insulating film 109 is formed on the first interlayer insulating film 107 and wirings 108 (108a and 108b), and the wiring 108a is connected to an electrode 110 of the light-emitting element through a contact hole provided in the second insulating film 109. While a portion of the second interlayer insulating film (a surface indicated by E-E'), below which there are the wirings 108, is planarized (planarization of micro unevenness), a step between the portion below which there are the wirings and a portion below which there are not the wirings (macro unevenness) is not planarized.

On the second interlayer insulating film 109 and the electrode 110 of the light-emitting element, a third interlayer insulating film that has an opening and flatness is provided, a portion of the electrode 110 of the light-emitting element is exposed in the opening of the third interlayer insulating film 111. Below the exposed electrode 110 of the light-emitting element in the opening of the third interlayer insulating film 111, the second insulating film 109 and the wiring 108a are provided. Here, a portion of the wiring 108a, particularly provided below the exposed electrode 110 of the light-emitting element in the opening of the third interlayer insulating film 111, functions as a film 114 for making a surface of the second interlayer insulating film higher. In the present embodiment mode, the film 114 has no optical transparency. In addition, the third interlayer insulating film 111 is also referred to as a bank.

Over the exposed electrode 110 of the light-emitting element in the opening of the third interlayer insulating film 111, a light-emitting layer 112 and an electrode 113 of the light-emitting element are formed. A portion where the electrode 110 of the light-emitting element, the light-emitting later 112, and the electrode 113 of the light-emitting element are formed and laminated functions as the light-emitting element 116. One of the electrodes 110 and 113 of the light-emitting element is an anode while the other is a cathode, and a structure (for example, a single layer or a multilayer) and a material of the light-emitting layer 112 are applied in accordance with the respective polarities.

Since the film 114 has no optical transparency as described above, it is not possible to take light emitted by the light-emitting element 116 from the lower side of the substrate 101. Consequently, the electrode 113 of the light-emitting element is formed of a conductive film that has optical transparency, and light emitted by the light-emitting element 116 is taken from the upper side of the substrate 101 (that is, the side where the electrode 113 of the light-emitting element is formed).

In the case of forming a wiring without the film 114, a surface of the first insulating film 107 becomes rough due to over-etching in processing the wiring, and micro unevenness is then formed at the surface. By providing the film 114, generation of micro unevenness to be generated at the surface of the first interlayer insulating film 107 can be suppressed.

However, for example, in the case of using a material such as aluminum, which generates a hillock and the like, as a material of the film 114, micro unevenness due to projections of the film 114 is sometimes formed at a surface of the second interlayer insulating film 109. In this case, the surface of the second interlayer insulating film 109 is required to be planarized. However, even in the case like this, it is effective to provide the film 114. This will be described below.

In the present embodiment mode, by providing the film 114, the surface of the second interlayer insulating film 109 is made higher when the surface of the first interlayer insulating film 107 is used as a base level. Therefore, in the case of using a planarizing method for first removing a surface of a convex portion, the surface of the second interlayer insulating film 109 above the film 114 can be locally planarized to make a planarizing process easier. An uneven portion left without being planarized by the local planarization like this is covered with the third interlayer insulating film 111 that has flatness. Therefore, providing the third interlayer insulating film 111 has also the effect that a planarizing process is made easier.

As described above, in the light-emitting device according to the present invention, the combination of the plural structures has a multiple effect that at least only a portion that is higher from a base level is required to be planarized (that is, only micro unevenness is required to be planarized). Therefore, a film thickness to be deposited and an amount to be polished can be reduced in a planarizing process.

Although the film 114 is integrated with the wiring, the present invention is not limited to this and may have a structure in which the film 114 is separated from the wiring. In addition, in the case where the film 114 is separated from the wiring, it is preferable that the film 114 has a film thickness equal to or thicker than that of the wiring. Herewith, the surface of the second interlayer insulating film formed on the film 114 can be made the highest from a base level to make a planarizing process easier. In addition, the processing time taken by a planarizing process is shortened, and damage to an element due to static electricity generated in a planarizing process can be suppressed.

EMBODIMENT MODE 2

Figure 5A:
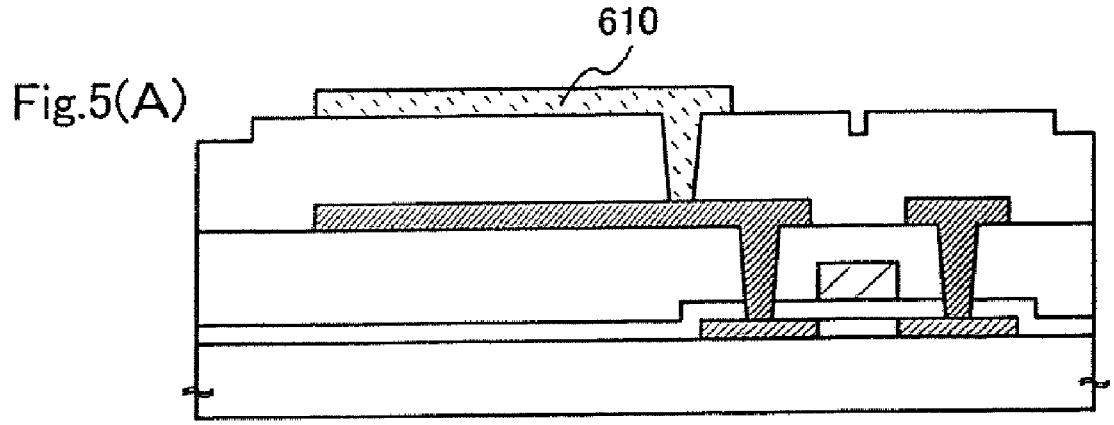
FIGS. 5A-5C are a sectional view of the process describing the method of manufacturing the light-emitting device according to the present invention.
Figure 5B:
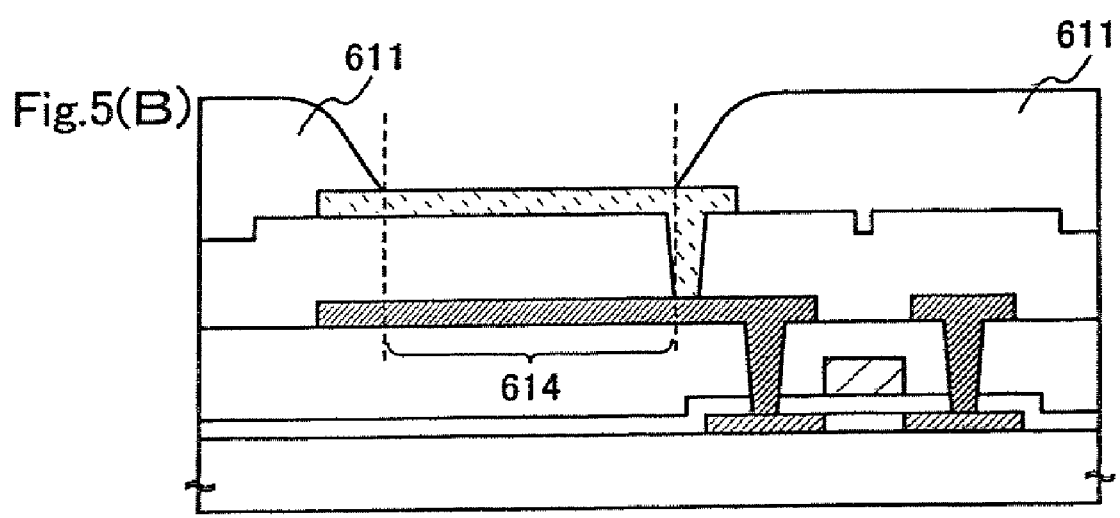
Figure 5C:
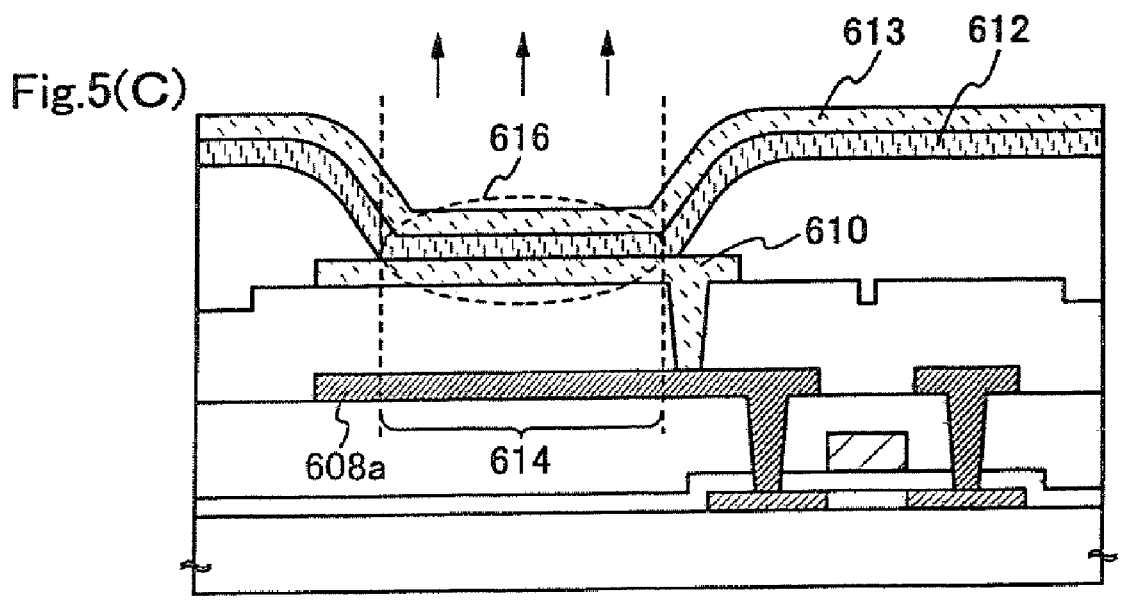
Figures 6A, 6B, 6C:
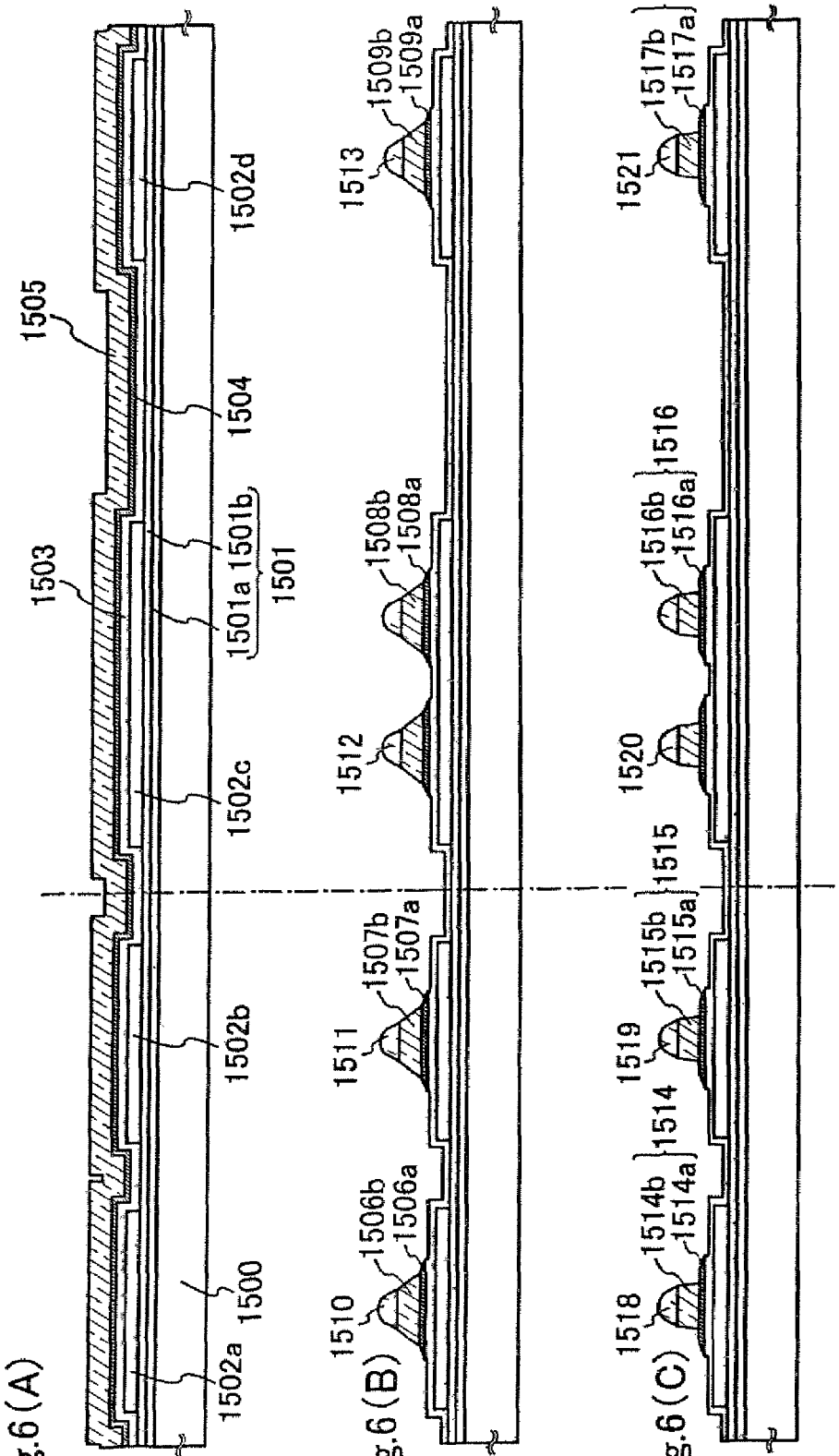
FIGS. 6A-6C are sectional views of processes describing a method of manufacturing a light-emitting device according to the present invention.
Figure 11:
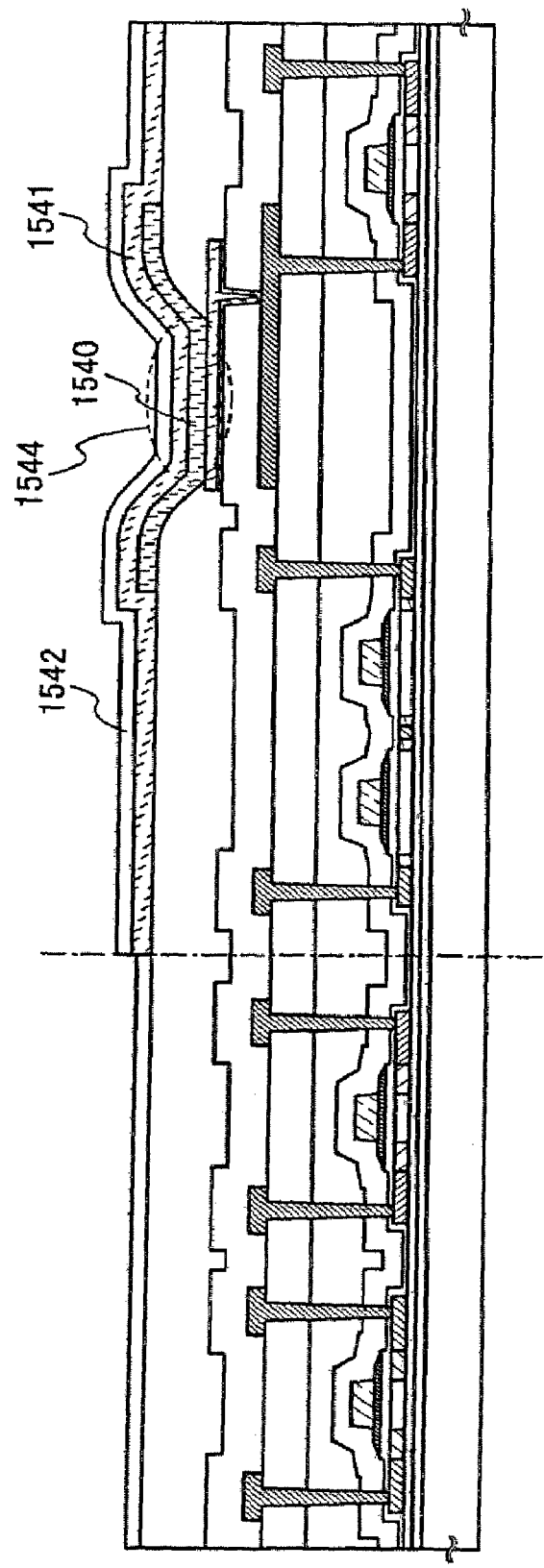
FIG. 11 is a sectional view of a process describing the method of manufacturing the light-emitting device according to the present invention.

In the present embodiment mode, a method of manufacturing a light-emitting device that has the structure shown in FIG. 1 will be described with reference to FIGS. 4 and 5 of sectional views of a process.

The structure of a TFT for driving a light-emitting element is not particularly limited, and a known structure may be used. For example, a top-gate TFT as shown in FIG. 1 may be employed or a bottom-gate TFT may be employed. Further, a TFT that has a single-gate structure may be employed or a TFT that has a multi-gate structure may be employed. Furthermore, a TFT that has an LDD (Lightly Doped Drain) structure may be employed and a TFT that has a single-drain structure may be employed. Besides, concerning crystallinity of the semiconductor film, an amorphous semiconductor film may be employed or a crystalline semiconductor film may be employed. In this way, as long as a thin film transistor includes a semiconductor film, a gate insulating film, and a gate electrode, and has a structure comprising a combination thereof, it is possible to use the thin film transistor regardless of the structure. Therefore, a known method is used to manufacture the TFT for driving the light-emitting element, and a description of a manufacturing process of the TFT for driving the light-emitting element is omitted here.

A TFT for driving a light-emitting element comprising a semiconductor film 603, a gate insulating film 605, and a gate electrode 606 is formed on a substrate 601. The semiconductor film 603 has a source (or a drain) 604a and 604b formed.

Next, a first interlayer insulating film 607 is formed to cover the TFT for driving the light-emitting element (and the gate insulating film 605). In order to form the first interlayer insulating film 607, a silicon oxide film may be formed by deposition to have a film thickness from 1.5 to 2.0 μm. In addition to the silicon oxide film, another insulating material may also be used.

Then, the first interlayer insulating film 607 is planarized. The planarization may be performed by CMP or the like. The planarization is performed so that the first interlayer insulating film has a surface wholly planarized. After the planarization, the first interlayer insulating film 607 on a surface of the gate electrode 606 in the highest position from a base level (a surface of the substrate 601 is set as the base level) is 1.0 to 1.5 μm in thick. The first interlayer insulating film 607 may have a film thickness to be deposited appropriately determined in consideration of a dielectric constant, an amount to be polished, a film thickness after polishing, and the like of a material that is used.

Next, contact holes are formed in the first interlayer insulating film, and wirings 608 (608a and 608b) connected to the source (or the drain) 604a and 604b are formed. A conductive material such as aluminum may be used to form the wirings 608. In addition, it is not always necessary to use a single layer for the wirings 608, and different conductive materials may be used to form a laminate film of two or more layers. In the present embodiment mode, the wirings 608 have a film thickness from 300 to 500 nm. However, the film thickness is not limited to this, and may be appropriately determined inconsideration of an ohmic value of a material.

The wiring 608a is formed also below a region in which a light-emitting element is formed later in a process, and this is referred to as a film 614 for making a surface of a second interlayer insulating film higher. In the present embodiment mode, the wiring 608a is integrated with the film 614.

Next, a second interlayer insulating film 609 is formed to cover the wirings 608 and the first interlayer insulating film 607. In order to form the second interlayer insulating film 609, a silicon oxide film may be formed by deposition to have a film thickness from 1.0 to 1.5 μm. In addition to the silicon oxide film, another insulating material may also be used.

Then, the second interlayer insulating film 609 is planarized. The planarization may be performed by CMP or the like. The second interlayer insulating film 609 has micro unevenness and macro unevenness formed, where the micro unevenness is generated due to influences such as hillock generated at the wirings 608 and surface roughness of the first interlayer insulating film 607 due to etching during the formation of the wirings 608 and the like, and the macro evenness is generated by covering the wirings.

Since the film 614 is formed in a portion over which a light-emitting element is formed later in a process, the portion is the highest from the base level to a surface of the second interlayer insulating film when a surface of the first interlayer insulating film is set as a base level. Polishing is preformed to planarize at least micro unevenness of the second interlayer insulating film 609 in the portion that is the highest from the base level to the surface of the second interlayer insulating film. In other words, the macro evenness of the second interlayer insulating film 609 need not be planarized to make planarization easier.

Next, a contact hole is formed in the second interlayer insulating film, and an electrode 610 of a light-emitting element, which is connected to the wiring 608a, is formed.

Next, a third interlayer insulating film 611 with an opening provided is formed in order to expose the electrode 610 of the light-emitting element in a portion that has the light-emitting element to be formed. The third interlayer insulating film uses resist as a material. As a material that is used for the third interlayer insulating film, it is preferable to use a photosensitive resin material that has self-planarization such as resist. However, an inorganic material or an organic material, which has no self-planarization, may be used to form the third interlayer insulating film 611, if necessary. The third interlayer insulating film is also referred to as an embankment or a bank.

The macro unevenness of the second interlayer insulating film 609 and a step generated due to the electrode 610 of the light-emitting element are covered with the third interlayer insulating film 611.

Next, a light-emitting layer 612 is formed on the electrode 610 of the light-emitting element. Further, an electrode 613 of the light-emitting element is formed on the light-emitting layer 612. A portion in which the electrode 610 of the light-emitting element, the light-emitting layer 612, and the electrode 613 of the light-emitting element are laminated serves as the light-emitting element 616.

In the present embodiment mode, the film 614 has no optical transparency. Therefore, it is not possible to take light emitted by the light-emitting layer 612 from the substrate side with the light-emitting layer 612 as a center. Consequently, the electrode 613 of the light-emitting element is formed of a conductive material that has optical transparency, and light transmitted through the electrode 613 of the light-emitting element is taken.

The light-emitting layer 612 need not be always formed of a single layer, and layers such as an electron transport layer and a hole transport layer may be added to be a multilayer structure. One of the electrodes 610 and 613 of the light-emitting element is an anode while the other is a cathode.

EMBODIMENTS

Embodiment 1

By applying the present invention, a film thickness to be deposited and an amount to be polished can be reduced in a planarizing process to make planarization easier.

A method of manufacturing a light-emitting device, to which the present invention is applied, will be described with reference to a top view in FIG. 3 and sectional views of processes in FIGS. 6 to 11.

Figure 3:
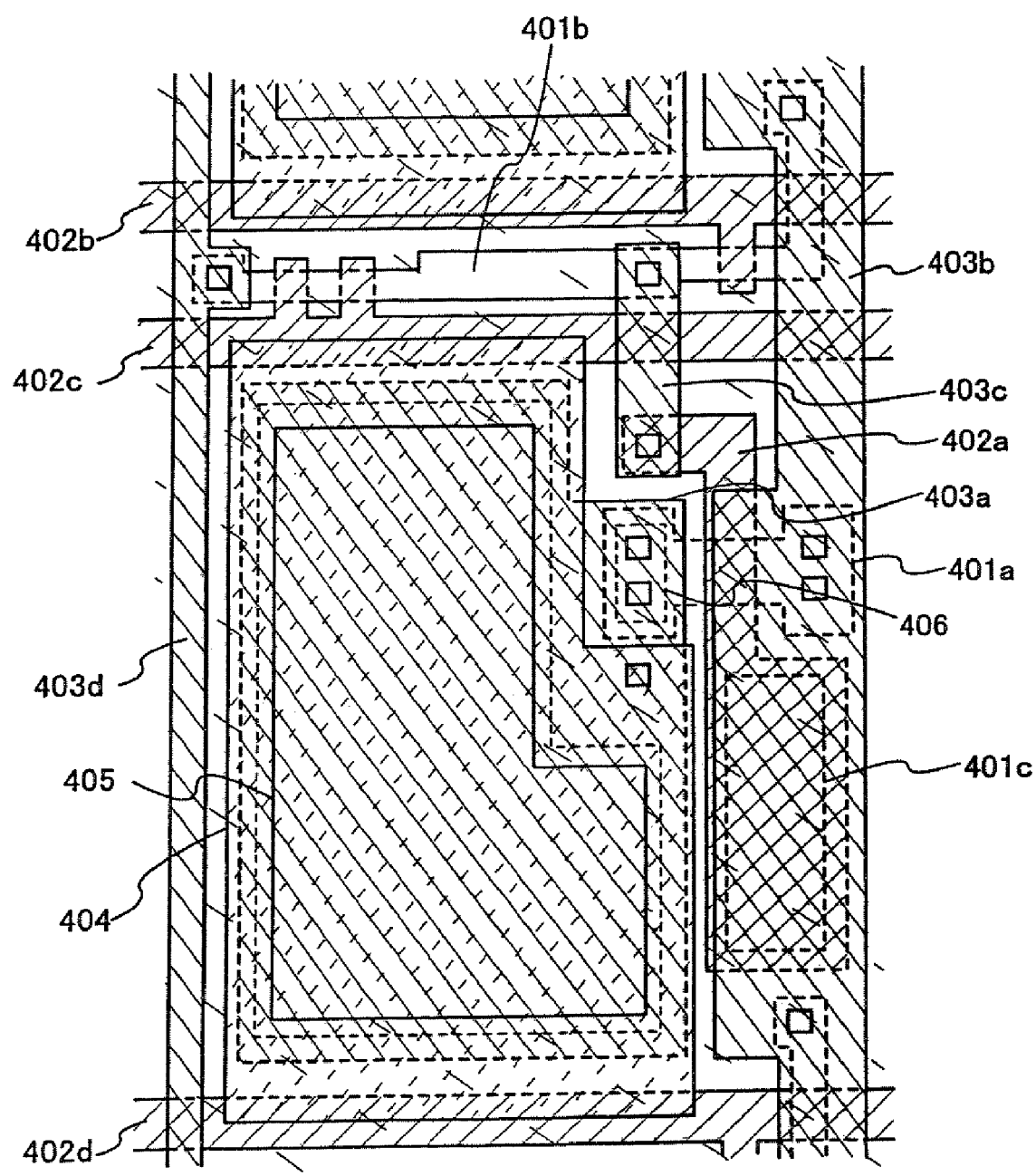
FIG. 3 is a top view describing a light-emitting device according to the present invention.
Figure 4A:
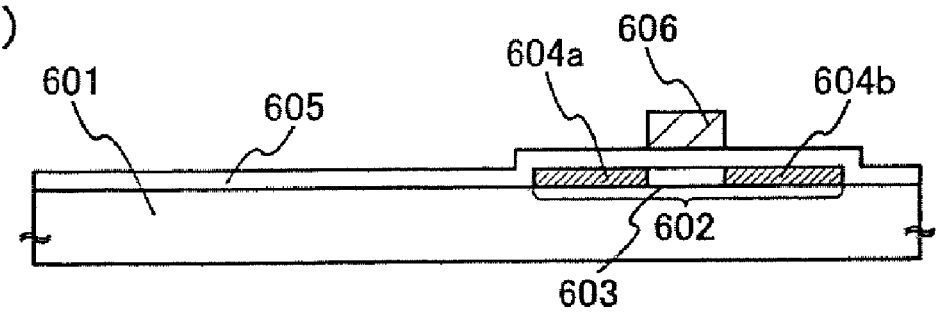
FIGS. 4A-4E are a sectional view of a process describing a method of manufacturing a light-emitting device according to the present invention.
Figure 4B:
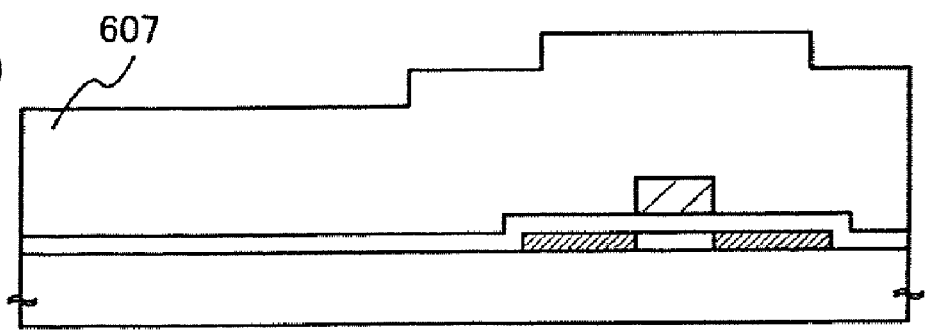
Figure 4C:
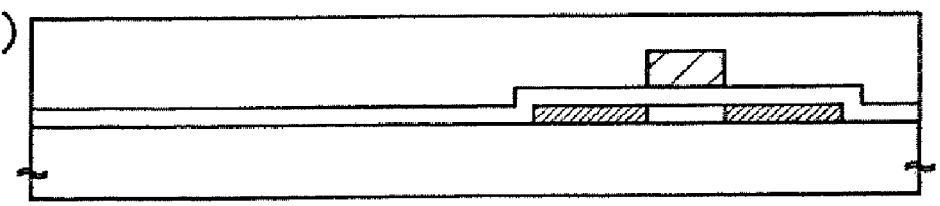
Figure 4D:
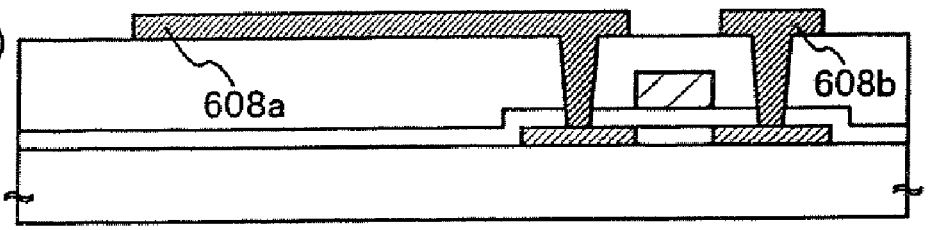
Figure 4E:
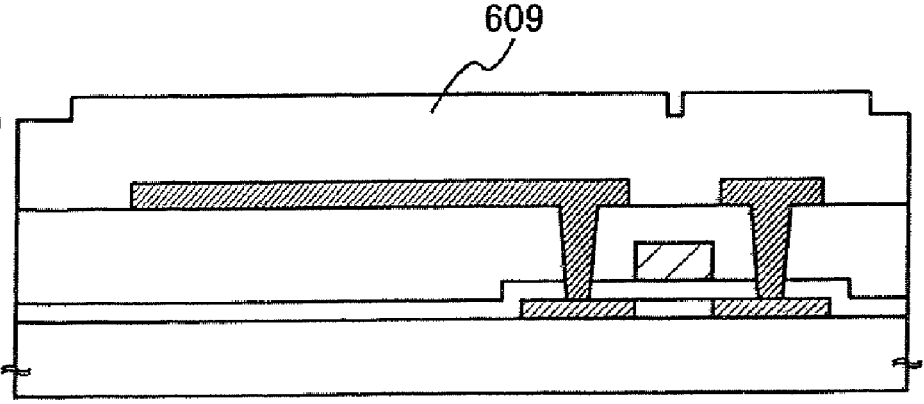

FIG. 3 shows a top view of a pixel portion of a light-emitting device to which the present invention is applied. In FIG. 3, a semiconductor film 401a is a semiconductor film of a thin film transistor (TFT) for driving a light-emitting element, and the semiconductor film 401a has a source (or a drain) connected to a wiring 403a through a contact hole in a region surrounded by a dotted line 406. The wiring 403a is also connected to an electrode 404 of the light-emitting element through a contact hole. In an opening of a third interlayer insulating film 405, a portion in which the wiring 403a and the electrode 404 of the light-emitting element are overlapped with each other with a second interlayer insulating film interposed therebetween is exposed. In this way, in the portion in which the wiring 403a and the electrode 404 of the light-emitting element are overlapped with each other, the wiring 403a functions as a film for making a surface of second interlayer insulating film higher. In FIG. 3, reference numerals 401b and 401c respectively indicate semiconductor films. In addition, reference numerals 402a, 402b, and 402d respectively indicate wirings, and the reference numerals 402b and 402d particularly indicate wirings that function as scan lines. Also, reference numerals 403b, 403c, and 403d respectively indicate wirings. In particular, the reference numeral 403b indicates a wiring that functions as a current supply line and the reference numeral 403d indicates a wiring that functions as a source line. Besides, a gate insulating film, a first interlayer insulating film, the second interlayer insulating film, a light-emitting layer, an electrode of the light emitting element over the light-emitting layer are not shown in FIG. 3.

On a substrate 1500, a base insulating film 1501a from 50 to 100 nm in film thickness and a base insulating film 1501b from 50 to 100 nm in film thickness are formed of a deposited laminate. The base insulating film 1501 (1501a and 1501b) is formed for preventing impurity diffusion from the substrate 1500 to a semiconductor film. In the present embodiment, low alkali glass is used, and a silicon nitride film that has a film thickness of 100 nm and a silicon oxide film that has a film thickness of 100 nm are formed by plasma CVD respectively for the base insulating films 1501a and 1501b. In addition, although the base insulating film is the deposited laminate of the two layers in the present embodiment, a single layer or a laminate film of three or more layers may be employed as long as the effect of preventing impurity diffusion. Although a substrate with translucency such as glass or quartz is used as a substrate in a manufacturing process of a TFT, another substrate may be used besides the substrate with translucency as long as the substrate can withstand processing temperatures in respective processes since a top-emission light-emitting device is manufactured in the present embodiment. For example, a plastic substrate may be used.

Next, semiconductor films 1502a to 1502d are formed on the base insulating film 1501. In order to form the semiconductor films 1502a to 1502d, a crystalline silicon film obtained by a known crystallization method (such as solid phase growth, laser crystallization, or solid phase growth using nickel as a catalytic metal element) is processed into a desired shape after a known deposition method (such as CVD or sputtering) is used to form an amorphous semiconductor film.

In the present embodiment, an amorphous silicon film that has a film thickness of 55 nm is formed by plasma CVD as the amorphous semiconductor film. Instead of the amorphous silicon film, another amorphous semiconductor film such as amorphous silicon germanium ($Si_xGe_{1-x}$ (x=0.0001 to 0.02)) may be used. Alternatively, a crystalline semiconductor film itself may be deposited instead of crystallizing an amorphous semiconductor film to obtain a crystalline semiconductor film. The film thickness is not limited to the above-mentioned film thickness, but may also be changed appropriately.

In addition, solid phase growth with nickel as a catalytic metal element (heat treatment at 550° C. for 4 hours) is used to crystallize the amorphous silicon film. In order to further improve crystallinity, excimer laser treatment is conducted, and then the crystalline silicon film is obtained.

Next, ozone water is used to form a thin oxide film on a surface of the crystalline silicon film, which has a film thickness from 1 to 2 nm, and an amorphous silicon film is formed thereon by sputtering to have a film thickness of 100 nm. Then, heat treatment with a furnace at 550° C. for 4 hours is conducted to move the catalytic metal element included in the crystalline silicon film to the amorphous silicon film (gettering). After the gettering, TMAH solution is used to remove the amorphous silicon film no longer required (after the gettering, the amorphous silicon film may be sometimes a crystalline silicon film due to an effect of the catalytic metal element), and hydrofluoric acid solution is further used to remove the thin oxide film.

Then, the crystalline silicon film is processed into a desired shape by patterning with photolithography and etching to form the semiconductor films 1502a to 1502d.

Before or after forming the semiconductor films 1502a to 1502d, impurity doping for controlling the threshold of a TFT (channel doping) may be performed. As an impurity to be doped, boron or phosphorus may be used.

In the case of using laser crystallization to form the crystalline semiconductor film, pulsed laser or continuous-wave laser that uses excimer (XeCl), YAG, or $YVO_4$ as a laser medium can be used. In the case of using excimer laser, the pulse oscillation frequency is set at approximately 300 Hz and the laser energy density is set from 100 to 400 $mJ/cm^2$. In the case of using YAG laser, the second harmonic is used, the pulse oscillation frequency is set from 30 to 300 Hz, and the laser energy density is set from 300 to 600 $mJ/cm^2$. It is also possible to condense an emitted laser beam into a linear laser beam in a linear shape that has a width from 100 to 1000 μm and irradiate the linear laser beam to the whole of the substrate with an overlap ratio of 50 to 90%.

Next, a gate insulating film 1503 is formed to cover the semiconductor films 1502a to 1502d. In the present embodiment, plasma CVD is used for deposition to form a silicon oxide film that has a film thickness of 110 nm. In addition to the silicon oxide film, another insulating film may also be used for the formation. The film thickness is not limited to the above-mentioned value, but may also be changed appropriately in consideration of a dielectric constant and the like.

Next, a laminate of a conductive film 1504 and a conductive film 1505 is formed on the gate insulating film 1503. In the present embodiment, tantalum nitride (TaN) that has a film thickness of 30 nm is deposited by sputtering to form the conductive film 1504 and tungsten (W) that has a film thickness of 370 nm is deposited as well by sputtering to form the conductive film 1505. The materials that are used for the conductive films 1504 and 1505 are not limited to tantalum nitride and tungsten, and an element selected from Ta, W, Ti, Mo, Al, Cu, Cr, and Nd, an alloy film or a compound material in combination with the element, or a semiconductor film typified by a polycrystalline silicon film doped with an impurity element such as phosphorus may be used. As the conductive film 1504, a material that has favorable adhesiveness to the gate insulating film may be selected, and a material that has a low resistance, from which an ohmic value about from 9 to 20 μΩcm is obtained, may be selected as for the conductive film 1505.

Next, the conductive films 1504 and 1505 are processed into a desired shape by pattering and etching. First, resist masks 1510 to 1513 that respectively have slope sidewalls are formed. Then, the resist masks 1510 to 1513 are used as masks to etch the conductive film 1505 and subsequently etch the conductive film 1504. Depending on angles of the slope sidewalls (taper angles) of the resist masks 1510 to 1513, the conductive film 1505 is processed into conductive films 1506b, 1507b, 1508b, and 1509b that have a taper angle of about 26°, and the conductive film 1504 is also processed into conductive films 1506a, 1507a, 1508a, and 1509a that have a taper angle from 15 to 45°.

Next, with resist masks 1518 to 1521 as masks, the conductive films 1506b, 1507b, 1508b, and 1509b are selectively etched. Hereby, the conductive films 1506b, 1507b, 1508b, and 1509b are processed into conductive films 1514b, 1515b, 1516b, and 1517b that respectively have nearly vertical sidewalls. In this case, it is required to use anisotropic etching mainly for the vertical direction. As the resist masks 1518 to 1521, the resist mask 1510 to 1513 used for the foregoing etching of the conductive films 1504 and 1505 are used as they are. The conductive films 1506a, 1507a, 1508a, and 1509a are not processed to remain as conductive films 1514a, 1515a, 1516a, and 1517a.

In this way, a gate electrode 1514 that has the conductive films 1514a and 1514b, a gate electrode 1515 that has the conductive films 1515a and 1515b, a gate electrode 1516 that has the conductive films 1516a and 1516b, and a gate electrode 1517 that has the conductive films 1517a and 1517b are formed.

Next, the gate electrodes 1514 to 1517 are used as masks to perform doping with a lower concentration of n-type impurity. In the present embodiment, the semiconductor films 1502a to 1502d are doped with phosphorus at a lower concentration of $1 \times 10^{17}$ $atoms/cm^3$ as the n-type impurity to form lower concentration impurity regions 1522a to 1522d. The doping with the impurity at the lower concentration is thus performed in order to form an LDD (Light Doped Drain) region for suppressing off-leakage current of a TFT, and the off-leakage current varies with the added impurity concentration. Therefore, the dose amount of the impurity is appropriately changed in order for off-leakage current to be a prescribed value or less. Although phosphorus is used as the n-type impurity in the present embodiment, besides this, another impurity may be used.

Next, resist masks 1525 to 1527 and the conductive film 1514b are used as masks to perform doping with an n-type impurity at a higher concentration. The resist mask 1525 is formed to cover the semiconductor film 1502b and the gate electrode 1515, the resist mask 1526 is formed to cover a portion of the semiconductor film 1502c (a portion to become an LDD region of a TFT) and the gate electrode 1516, and the resist mask 1527 is formed to cover the semiconductor film 1502d and the gate electrode 1517. In the present embodiment, a portion of the semiconductor film 1502a above which the conductive film 1514a is not formed and a portion of the semiconductor film 1502c above which the resist mask 1526 is not formed are doped with phosphorus at a higher concentration of $1\times10^{20}$ atoms/cm$^3$. At the same time, another portion of the semiconductor film 1502a above which the conductive film 1514a is formed is doped with phosphorus at a lower concentration of $1\times10^{18}$ atoms/cm$^3$. In consequence, a source (or a drain) 1523a or 1523b including phosphorus at the higher concentration and a lower concentration impurity region 1524 including phosphorus at the lower concentration are formed, which utilizes that the portion above which the conductive film 1514a is formed has a different blocking capability against the added impurity from the portion above which the conductive film 1514a is not formed. Although phosphorus is used as the n-type impurity in the present embodiment, besides this, another impurity may be used.

Next, resist masks 1530 and 1531 and the conductive films 1515b and 1517b are used as masks to perform doping with a p-type impurity at a higher concentration. The resist mask 1530 is formed to cover the semiconductor film 1502a and the gate electrode 1514 and the resist mask 1531 is formed to cover the semiconductor film 1502c and the gate electrode, 1516. In the present embodiment, a portion of the semiconductor film 1502b above which the conductive film 1515a is not formed and a portion of the semiconductor film 1502d above which the conductive film 1517a is not formed are doped with boron at a higher concentration of $1\times10^{20}$ atoms/cm$^3$ to form a source (or a drain) 1528a or 1529a. At the same time, another portion of the semiconductor film 1502b above which the conductive film 1515a is formed and another portion of the semiconductor film 1502d above which the conductive film 1517a is formed are doped with boron at a lower concentration of $1\times10^{19}$ atoms/cm$^3$ to form lower concentration impurity regions 1528b and 1529b. Although boron is used as the p-type impurity in the present embodiment, besides this, another impurity may be used.

In this way, TFTs 1550 to 1553 are manufactured. The TFTs 1550 and 1551 serve as TFTs for a driver circuit, and the TFT 1552 and the TFT 1553 serve as TFTs for driving a light-emitting element.

Then, heat treatment is performed for activating the added impurities. In the present embodiment, heat treatment with a furnace at 550° C. for 4 hours is performed in a nitrogen atmosphere that has an oxygen concentration of 0.1 ppm or less. The heat treatment is performed in the nitrogen atmosphere that has an oxygen concentration of 0.1 ppm or less in order to prevent the gate electrodes 1514 to 1157 from being oxidized. When an insulating film such as a silicon oxide film is formed on the TFTs 1550 to 1553 in order to prevent oxidation of the gate electrodes 1514 to 1517, the oxygen concentration may range from 0.1 ppm to 1 ppm. Instead of the furnace, another method such as activation with laser or RTA (Rapid Thermal Anne may be used.

Next, an interlayer insulating film 1532a is formed to cover the TFTs 1550 to 1553. In the present embodiment, plasma CVD is used to deposit a silicon oxynitride film (SiNO) that has a film thickness of 100 nm to form the interlayer insulating film 1532a. In addition to the silicon oxynitride film, another insulating film may also be used for the formation. Also, the film thickness is not limited to the above-mentioned value, but may also be changed appropriately in consideration of a dielectric constant and the like.

Then, hydrogenation is performed for terminating dangling bonds of the semiconductor films. In the present embodiment, heat treatment 410° C. for 1 hour is performed in an atmosphere of 100% hydrogen to perform hydrogenation. Instead of hydrogenation by heat treatment, hydrogenation with plasma may be performed.

Then, an interlayer insulating film 1552b is formed on the interlayer insulating film 1532a. In the present embodiment, plasma CVD is used to deposit a silicon oxide film that has a film thickness of 1.2 μm to form the interlayer insulating film 1532b. In addition, CMP (Chemical Mechanical Polishing) is used so that the interlayer insulating film 1532b has a surface wholly planarized. In addition to the silicon oxide film, another insulating film may also be used to form the interlayer insulating film 1532b. Also, the film thickness is not limited to the above-mentioned value, but may also be changed appropriately in consideration of a dielectric constant, an amount of a film reduced by planarization, and the like. In the present embodiment, after the planarization, the interlayer insulating film has a film thickness about 600 nm on the conductive films 1514b, 1515b, 1516b, and 1517b of the TFTs 1550 to 1553.

Then, an interlayer insulating film 1532c is further formed on the interlayer insulating film 1532b. In the present embodiment, plasma CVD is used to deposit a silicon oxide film that has a film thickness of 600 nm to form the interlayer insulating film 1532c. In addition to the silicon oxide film, another insulating film may also be used to form the interlayer insulating film 1532c. Also, the film thickness is not limited to the above-mentioned value, but may also be changed appropriately in consideration of a dielectric constant and the like.

In this way, a first interlayer insulating film 1532 comprising the interlayer insulating films 1532a, 1532b, and 1532c is formed. Here, the interlayer insulating film 1532c has a surface planarized since the interlayer insulating film 1532b is planarized which is to say that the first interlayer insulating film 1532 a wholly planarized surface.

Next, contact holes reaching the sources (or drains) 1523a, 1523b, 1528a, and 1528b are formed by patterning and etching. In the present embodiment, after patterning, the interlayer insulating films 1532b and 1532c are etched by wet etching that uses hydrofluoric acid containing solution and the interlayer insulating film 1532 is subsequently etched to form a contact hole.

Then, wirings for transmitting electrical signals, to the TFTs 1550 to 1553 are formed. In the present embodiment, after sputtering is used to laminate titanium (Ti), aluminum alloy containing silicon at a few percentage (Al—Si), titanium (Ti) that respectively have film thicknesses of 100 nm, 350 nm, and 100 nm, a process is conducted by patterning and etching to form wirings 1533 (1533a and 1533b), 1534, 1535, and 1536. Here, the wiring 1533a is formed to extend to a portion below a light-emitting element to be later manufactured in a process. As materials of the wirings 1533 to 1536, conductive materials may be used in addition to the material mentioned above. In addition, it is not always necessary to have three layers, and a single layer, a laminate film of two layers, or a laminate film of four or more layers may be employed. Also, the film thicknesses are not limited to the above-mentioned values, but may also be appropriately determined in consideration of a wiring resistance and the like.

Next, a second interlayer insulating film 1537 is formed on the wirings 1533 to 1536 and the first interlayer insulating film 1532. In the present embodiment, CVD is used for deposition to form a silicon oxide film that has a film thickness of 600 nm. In addition, CMP (Chemical Mechanical Polishing) is used to have a portion of the second interlayer insulating film 1537 planarized. The planarized portion of the second interlayer insulating film 1537 has average surface roughness (Ra) of about 3.3 nm according to a measurement result of AFM (Atomic Force Microscope). The planarization of the interlayer insulating film 1532 is conducted as described below.

When a surface of the first interlayer insulating film 1532 is set as a base level, heights from the base level to surfaces of the second interlayer insulating film 1537 are roughly classified into two heights that are a height corresponding to the sum of the film thickness of the wiring and the second interlayer insulating film 1537 (a higher one) and a height corresponding to the film thickness of the second interlayer insulating film 1537 (a lower one). In addition, the second interlayer insulating film 1537 has macro unevenness (a step) formed by the foregoing difference in height and micro unevenness due to influences such as hillock generated at the wirings. Since the wiring 1533a is formed below a portion for forming the light-emitting element as described above, the height from the base level to the surface of the second interlayer insulating film 1537 is, at the portion, classified into the higher one. In the present embodiment, polishing is conducted so that, of the second interlayer insulating film 1537, only micro unevenness of a portion that is higher from the base level is planarized. In other words, at least the portion for forming the light-emitting element, which needs to be planarized, is subjected to planarization while the macro unevenness is left without being planarized. Therefore, a film thickness to be deposited and an amount to be polished for the second interlayer insulating film 1537 can be reduced. The wiring 1533a is provided below the portion to be the light-emitting element so that only the minimum portion that needs to be planarized can be planarized in this way. In the specification, a portion of the wiring 1533a, which needs no function as an electrode in this way, serves as a film 1543 (the reference numeral 406 in FIG. 3) for making the surface of the second interlayer insulating film higher.

An insulating material other than the foregoing silicon oxide may be used to form the second interlayer insulating film 1537. In addition, the film thickness may also be appropriately determined in consideration of, an amount of a dielectric constant, a film reduced by polishing and the like.

Next, a contact hole reaching the wiring 1533a is formed by patterning and etching. In the present embodiment, the second interlayer insulating film 1537 has a contact hole formed by patterning and etching.

Next, an electrode 1538 (1538a and 1538b) of the light-emitting element is formed. In the present embodiment, aluminum alloy containing silicon at a few percentage (Al—Si) and amorphous ITO (Indium Tin Oxide) are formed by sputtering to have film thicknesses of 30 nm and 20 nm respectively. The electrode 1538b of the light-emitting element functions as an anode in the present embodiment. In addition, the Al—Si functions as a reflective film for reflecting light emitted by the light-emitting element. The thin film Al—Si with the film thickness of 30 nm has about 20-nm unevenness due to hillock, which is sufficiently covered with a light-emitting layer. Therefore, it is preferable to form the reflective film from 10 nm to 30 nm. In the case of 10 nm or less, emitted light is sometimes transmitted through the reflective film to make the reflective film function insufficiently. The ITO has a high work function, and is therefore a material that is generally used as an anode of a light-emitting element.

In the present embodiment, after patterning, a solution including oxalic acid (($COOH)_2$) at a concentration of 5.0% or less is used at a solution temperature of 45° C. to etch the ITO, and thereby, the electrode 1538b of the light-emitting element is formed. Subsequently, the Al—Si is etched by dry etching that uses chlorine-based gas to form the electrode 1538a of the light-emitting element.

In addition to the materials described above, another material may also be used to form the electrode 1538 of the light-emitting element. In addition, a single layer, a laminated structure of two layers, or a laminated structure of four or more layers may be employed. The film thickness may also be appropriately changed.

Then, the ITO is crystallized by heating at 250° C. for two hours. The heating temperature and the heating time may be appropriately changed in consideration of crystallinity of the ITO and the like.

Next, a bank 1539 that is a partition layer with an opening provided is formed to expose a portion of the electrode 1538 of the light-emitting element (a portion that serves as an anode of the light-emitting element). In the present embodiment, resist is processed with the use of photolithography to form the bank 1539 with 1.4 μm in film thickness. The unevenness of the second interlayer insulating film 1537, which is left without being planarized, is covered with the bank 1539. The unevenness of the second interlayer insulating film 1537 and a step formed by the electrode 1538 of the light-emitting element resolved by the bank 1539 since resist is a material that has self-planarization. As the resist that is used as a third interlayer insulating film, one that promotes no degradation of the light-emitting element is selected from a lot of commercially produced resists, and used. However, the resist that is used in the present embodiment has no heat resistance against the temperature for crystallizing the ITO. The bank 1539 is also usually referred to as an embankment.

In addition to resist, organic resin materials such as acrylic (including both photosensitive acrylic and non-photosensitive acrylic) and polyimide (including both photosensitive polyimide and non-photosensitive polyimide) and inorganic materials such as a silicon oxide film may also be used for the formation. In the present embodiment, an edge of the bank 1539 is not angulated but has a rounded shape. In addition, the electrode 1538 of the light-emitting element, which is exposed in the opening of the bank 1539, has a surface with flatness that has no influence on the light-emitting element to be formed in the subsequent process.

Figure 13:
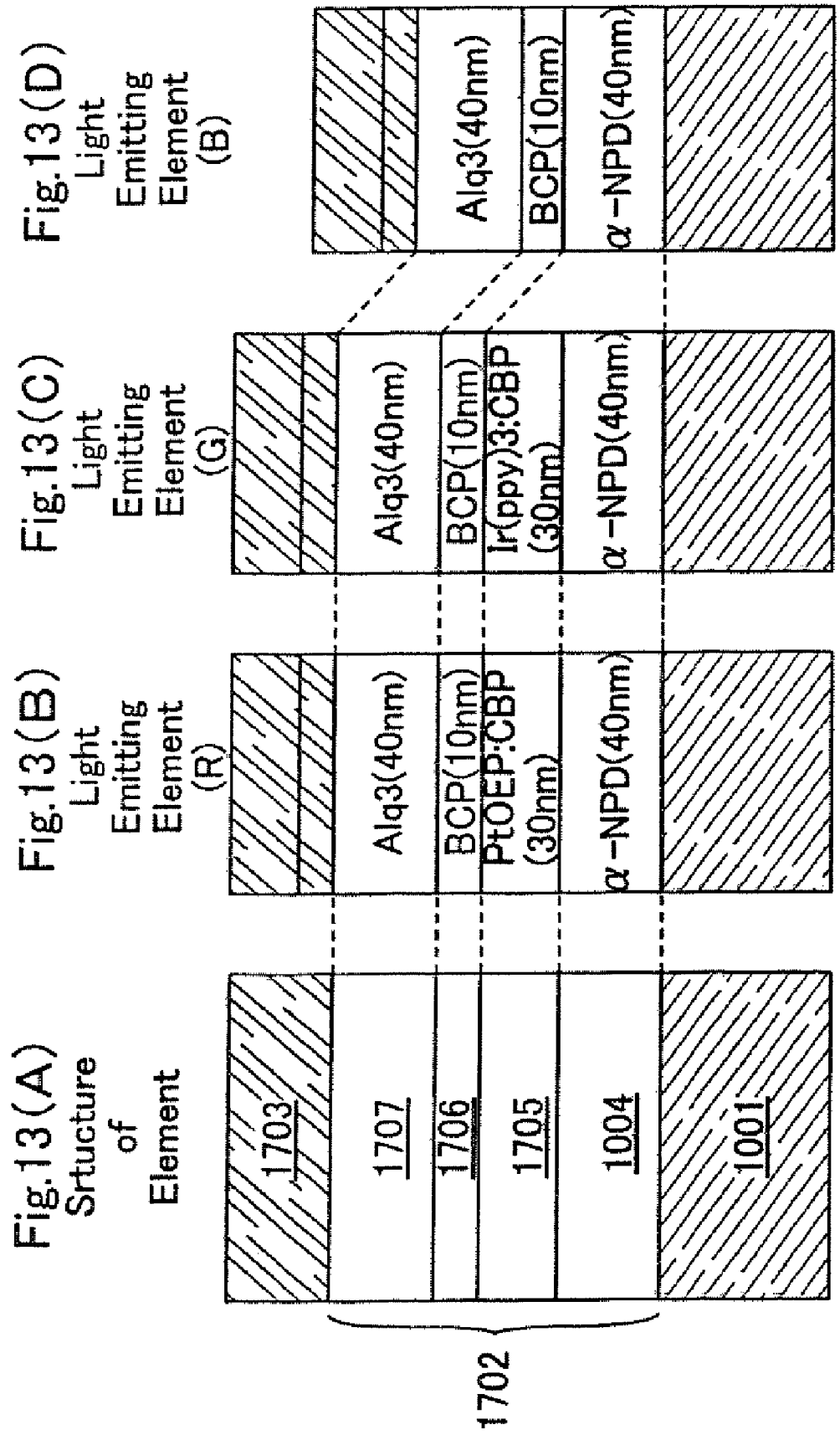
FIGS. 13A-13D are a diagram describing a structure of a light-emitting element in a light-emitting device according to the present invention.

On the electrode 1538 of the light-emitting element, a layer including an organic compound 1540 is formed by evaporation. Although how to form one kind of layers respectively including organic compounds, which show three kinds of light emissions of red, green, and blue in the present embodiment, is shown here, a combination of organic compounds forming each of the three kinds of layers respectively including the organic compounds will be described with reference to FIG. 13.

FIG. 13(A) shows a light-emitting element comprising an anode 1701, an organic compound layer 1702, and a cathode 1703, and the layer including the organic compound 1702 has a laminated structure of a hole transport layer 1704, a light-emitting layer 1705, a blocking layer 1706, and an electron transport layer 1707. FIG. 13(B) shows materials and thicknesses forming a light-emitting element that shows red light emission, FIG. 13(C) shows materials and thicknesses forming a light-emitting element that shows green light emission, and FIG. 13(D) shows materials and thicknesses forming a light-emitting element that shows blue light emission.

First, a layer including an organic compound that shows red light emission is formed. Specifically, 4,4'-bis[N-(1-naphtyle)-N-phenyl-amino]-biphenyl (hereinafter, referred to as α-NPD) that is a hole transport organic material is deposited to have a film thickness of 40 nm for the hole transport layer 1704, 2, 3, 7, 8, 12, 13, 17, 18-octaethyl-21H, 23H-porphine-platinum (hereinafter, referred to as PtOEP) that is a light-emitting organic compound and 4'4-dicarbazol-biphenyl (hereinafter, referred to as CBP) that is an organic compound that serves as a host (hereinafter, a host material) are co-evaporated to have a film thickness of 30 nm for the light-emitting layer 1705, bathocuproin (hereinafter, referred to as BCP) that is a blocking organic material is deposited to have a film thickness of 10 nm for the blocking layer 1706, and tris (8-quinolinolato) aluminum (hereinafter, $Alq_3$) that is an electron transport organic material is deposited to have a film thickness of 40 nm for the electron transport layer 1707, thereby the layer including the organic compound that shows red light emission is formed.

Although the case where five kinds of organic compounds that respectively have different functions are used to form the layer including the organic compound that shows red light emission is described here, the present invention is not limited to this, and a known material can be used as the organic compound that shows red light emission.

Next, a layer including an organic compound that shows green light emission is formed. Specifically, α-NPD that is a hole transport organic material is deposited to have a film thickness of 40 nm for the hole transport layer 1704, CBP that is used as a hole transport host material and tris (2-phenylpyridine) iridium ($Ir(ppy)_3$) that is a light-emitting organic compound are co-evaporated to have a film thickness of 30 nm for the light-emitting layer 1705, BCP that is a blocking organic material is deposited to have a film thickness of 10 nm for the blocking layer 1706, and $Alq_3$ that is an electron transporting organic material is deposited to have a film thickness of 40 nm for the electron transport layer 1707, thereby the layer including the organic compound that shows green light emission can be formed.

Although the case that five kinds of organic compounds that respectively have different functions are used to form the layer including the organic compound that show green light emission is described here, the present invention is not limited to this, and a known material can be used as the organic compound that show green light emission.

Next, a layer including an organic compound that shows blue light emission is formed. Specifically, α-NPD that is a light-emitting and hole transport organic material is deposited to have a film thickness of 40 nm for the light-emitting layer 1705, BCP that is a blocking organic material is deposited to have a film thickness of 10 nm for the blocking layer 1706, and $Alq_3$ that is an electron transporting organic material is deposited to have a film thickness of 40 nm for the electron transport layer 1707, thereby the layer including the organic compound that shows blue light emission can be formed.

Although the case that three kinds of organic compounds that respectively have different functions are used to form the in the layer including the organic compound that shows blue light emission is described here, the present invention is not limited to this, and a known material can be used as the organic compound that show blue light emission.

The layers respectively including the organic compounds, which respectively show red light emission, green light emission, and blue light emission, can be formed in a pixel portion by forming the organic compounds described above on the anode.

Next, an electrode 1541 of the light-emitting element is formed to cover the layer including the organic compound 1540 and the bank 1539. In the present embodiment, the electrode 1541 of the light-emitting element function as a cathode. In addition, the electrode 1541 of the light-emitting element is formed of ITO that has a high transmittance to visible light. Since ITO is a material that has a high work function, ITO is a material that is not too appropriate for the cathode. Consequently, in the present embodiment, lithium fluoride is formed to have a film thickness of 2 nm so as to cover the organic compound layer 1540 and the bank 1539 before forming the electrode 1541 of the light-emitting element, thereby an electron injection efficiency is improved.

In addition to ITO, a material that belongs to alkali metal or alkali earth metal may be used as a simple substance, the material and another material may be laminated, and an alloy formed of the material and another material (for example, Al:Mg alloy, Al:Li alloy, Mg:In alloy) may also be used. Besides, one that is not the materials described above may be used to form the electrode 1541 of the light-emitting element as long as the conductive film has a low work function and a high transmittance to visible light.

In this way, the light-emitting element 1544 comprising the electrode 1538 of the light-emitting element, the layer including the organic compound 1540, and the electrode 1541 of the light-emitting element is formed.

Next, a protective film 1542 for protecting the light-emitting element 1544 is formed. In the present embodiment, a silicon nitride film is formed by sputtering to form the protective film 1542. In addition to the silicon nitride film, another material such as DLC (Diamond like Carbon) may also be used for the formation.

In this way, a light-emitting device to which the present invention is applied is manufactured.

In the present embodiment, the film 1543 has no optical transparency. Therefore, the electrode 1541 of the light-emitting element is formed of a material that has a high transmittance to visible right as described above to enable taking light emitted by the light-emitting element 1544 from the side of the electrode 1541 of the light-emitting element with the layer 1540 including the organic compound as a center. In addition, in order to increase a light extraction efficiency of emitted light, the electrode 1538a of the light-emitting element, which functions as a reflective film, is formed. Instead of using the electrode 1538a of the light-emitting element, emitted light may be reflected by the film 1543 to improve a light extraction efficiency.

Besides, in the present embodiment, the electrode 1541 of the light-emitting element serves as a cathode while the electrode 1538 of the light-emitting element serves as an anode. However, not limited to this, the electrode 1541 of the light-emitting element may serve as an anode while the electrode 1538 of the light-emitting element serves as a cathode. In that case, the electrodes 1538 and 1541 and the layer 1540 including the organic compound respectively have materials and structures, which are appropriately changed.

Embodiment 2

In the present embodiment, a light-emitting device that has a different structure of the electrode 1538 of the light-emitting element from that shown in Embodiment 1 will be described.

In a light-emitting element of the present embodiment, the electrode 1538 of the light-emitting element has a structure that has aluminum alloy containing silicon at a few percentage (Al—Si), titanium nitride (TiN), and amorphous ITO (Indium Tin Oxide) laminated respectively to have film thicknesses of 30 nm, 10 nm, and 20 nm. As well as Embodiment 1, the ITO is provided in the side of a light-emitting layer to be formed.

In this way, by providing TiN between Al—Si and ITO, the Al—Si and the ITO can be prevented from having contact with each other, and generation of electrolytic corrosion can be suppressed in an etching process of the ITO.

The components expect the electrode 1538 of the light-emitting element are similar to those described in Embodiment 1.

Embodiment 3

In the present embodiment, of light-emitting devices according to the present invention, which respectively have structures that makes it possible to reduce a film thickness to be deposited and an amount to be polished in a planarizing process, a light-emitting device that uses a film for making a surface of the second interlayer insulating film higher as a reflective film will be described with reference to FIG. 14.

Figure 14:
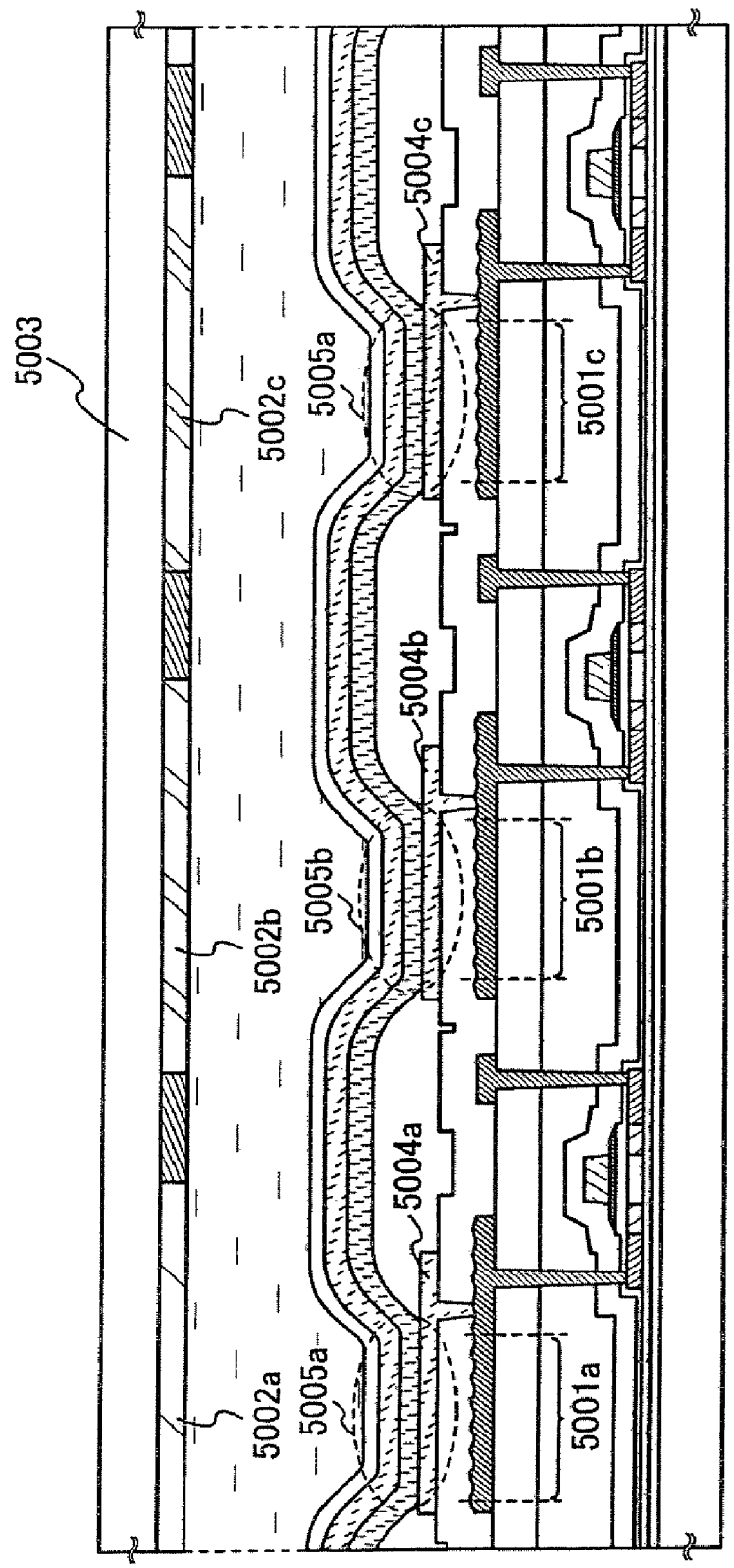
FIG. 14 is a sectional view describing a light-emitting device according to the present invention.

FIG. 14 shows a sectional view in a pixel portion of a light-emitting device. Light-emitting elements 5005 (5005*a*, 5005*b*, and 5005*c*) emit white light. Since white light is emitted by either light-emitting element, a mask for selectively forming a light-emitting layer with respect to each color is not necessary. Light emitted by each element is transmitted through a color filter 5002 (5002*a*, 5002*b*, or 5002*c*) and taken from a side of an opposed substrate 503. The color filter 5002 is provided to correspond to each, of R, G, and B that are light's three primary colors.

Besides, an electrode of the light-emitting element 5004 (5004*a*, 5004*b*, or 5004*c*) is formed of a material that has optical transparency, and a portion of emitted light is transmitted through the electrode 5004 of the light-emitting element to reach a film 5001 (5005*a*, 5005*b*, or 5005*c*). The film 5001 is formed of a material that has a favorable reflectivity to visible light, and therefore the light at the film 5001 is reflected and transmitted through the color filter 5002 (5002*a*, 5002*b*, or 5002*c*) and taken from the side of the opposed substrate 503. Accordingly, a light extraction efficiency is improved.

At a surface of the film 5001, unevenness is provided. Therefore, interference of light reflected at an interface between a second interlayer insulating film and the electrode 5004 of the light-emitting element and light reflected at the surface of the film 5001 can be suppressed. By applying the present invention, unevenness of the second interlayer insulating film formed between the electrode 5004 of the light-emitting element and the film 5001, which is formed due to the unevenness formed at the surface of the film 5001, is planarized. Therefore, in the light-emitting element of the present embodiment, the film 5001 has an effect for making planarization easier and an effect for increasing a light extraction efficiency.

In the present embodiment, a film that has titanium (Ti), titanium nitride (TiN), and aluminum alloy containing silicon at a few percentage laminated in this order is used to form the film 5001. In addition, hillock is generated on purpose by a heat treatment process at the surface of the film 5001 to form the unevenness. Consequently, TiN is formed as a barrier film in addition to Ti in order the hillock to have no influence on a source (or a drain) of a TFT for driving the light-emitting element. The electrode 5004 of the light-emitting element is formed of a single layer film with the use of ITO. The materials described in Embodiment 1 or Embodiment 2 are used to form the other parts.

Embodiment 4

Figure 12:
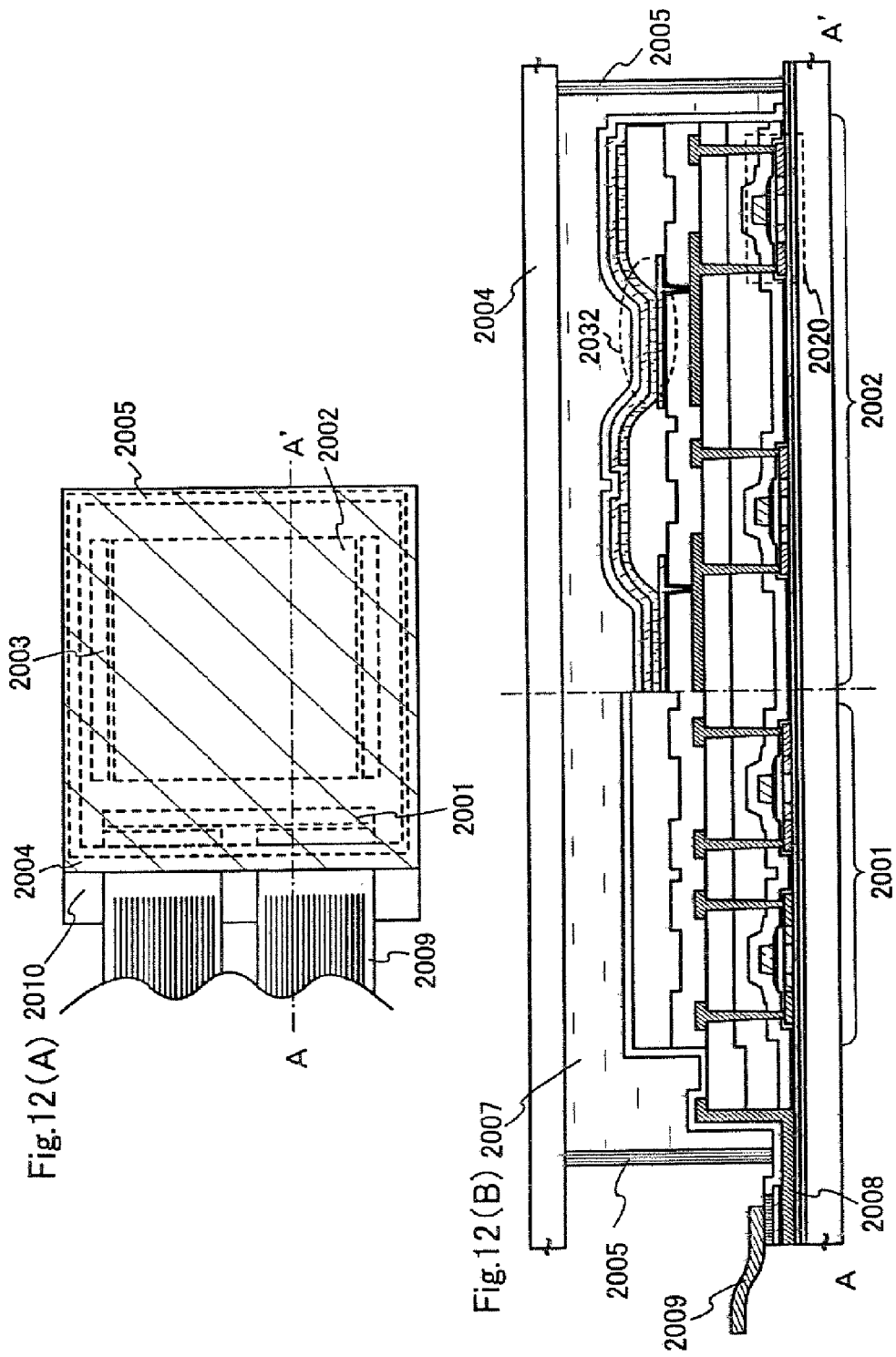
FIGS. 12A-12B are a diagram describing an active matrix EL display manufactured by applying the present invention.

In the present embodiment, an active matrix EL display manufactured with the present invention applied will be described with reference to FIG. 12. A top-emission active matrix EL display has a structure that makes it possible to reduce a film thickness to be deposited and an amount to be polished in a planarizing process to make planarization easier. By a planarization process made easier, generation of trouble in the process is reduced and the yield is improved. In addition, a light extraction efficiency can be improved by providing a reflective film for a pixel electrode or using a film for making a surface of a second interlayer insulating film higher as a reflective film, which is provided to make planarization easier.

FIG. 12(A) is a top view showing a light-emitting device and FIG. 12(B) is a sectional view of FIG. 12(A) cut along A-A'. A reference numeral 2001 indicated by a dotted line is a source signal line driver circuit, 2002 is a pixel portion, and 2003 is a gate signal line driver circuit. In addition, a reference numeral 2004 is a sealing substrate and 2005 is a sealing agent. The inside surrounded by the sealing substrate 2004 and the sealing agent 2005 is space.

A reference numeral 2008 (2008*a* and 2008*b*) is a wiring for transmitting signals to be input to the source signal line driver circuit 2001 and the gate signal line driver circuit 2003, and receives a video signal and a clock signal from FPC (Flexible Printed Circuit) 2009 that serves as an external input terminal. Though only the FPC is shown in the figure here, a printed wiring board (PWB) may be attached to the FPC. A light-emitting device in the specification includes not only a light-emitting device body but also a state where an FPC or a PWB is attached thereto.

The sectional structure will be explained with reference to FIG. 12(B). The driver circuits and the pixel portion are formed over the substrate 2010. Here, the source signal line driver circuit 2001 as the driver circuit and the pixel portion 2002 are shown. In the source signal line driver circuit 2001, a CMOS circuit is formed of a combination of an n-channel TFT and a p-channel TFT. The TFTs forming the driver circuit may also be formed of a known CMOS circuit, PMOS circuit, or NMOS circuit. Although the present embodiment shows a driver integrated type in which a driver circuit is formed over a substrate, which is not always necessary, the driver circuit can be formed not on the substrate but at the outside thereof. The pixel portion 2002 is formed of a plurality of pixels including an electrode that has an anode of a light-emitting element 2032 integrated with a source electrode for transmitting electrical signal to a TFT for driving the light-emitting element 2020.

A cathode and an anode are electrically connected to an FPC via a connecting wiring. In FIG. 12(B), the anode is electrically connected to the FPC 2009 via the connecting wiring 2008.

In order to seal a light-emitting element 2032, the sealing substrate 2004 is bonded with the sealing agent 2005. In order to hold the distance between the sealing substrate 2004 and the light-emitting element 2032, a spacer comprising a resin film may be provided. The space 2007 inside the sealing agent 2005 is filled with inert gas such as nitrogen. As the sealing agent 2005, epoxy resin is preferably used. It is also desirable that the sealing agent 2005 is a material that prevents permeation of moisture or oxygen as much as possible. Additionally, a material that has an effect of absorbing oxygen and moisture may be contained in the space 2007.

In the present embodiment, as a material constituting the sealing substrate 2004, a plastic substrate comprising FRP (Fiberglass-Reinforced Plastics), PVF (polyvinylfluoride), Mylar, polyester, acrylic, or the like can be used besides a glass substrate and a quarts substrate. After using the sealing agent 2005 to bond the sealing substrate 2004, it is also possible to perform further sealing with a sealing agent to further cover a side face (exposed face).

As described above, when the light-emitting element is encapsulated in the space 2007, the light-emitting element can be shield completely from the outside, and moisture or oxygen that promotes deterioration of an organic compound layer can be prevented from penetrating from the outside. Accordingly, a light-emitting device with high reliability can be obtained.

The n-channel TFT, the P-channel TFT, and the TFT for driving the light-emitting element are not particularly limited, and any structure such as a single drain structure, an LDD structure, a single gate structure, or a double gate structure can be applied.

Embodiment 5

In the present embodiment, an electronic device that has an active matrix EL display manufactured with the present invention applied will be described with reference to FIG. 15. In the case of manufacturing an active matrix EL display manufactured with the present invention applied, as a result of a planarizing process made easier, generation of trouble in the planarizing process is reduced and the yield is improved. In particular, as a substrate for manufacturing a display is larger, the effect of the planarizing process made easier (the margin to fluctuations in polishing rate and the like is expanded) is large since the fluctuations in polishing rate and the like are larger in a plane of the substrate. In addition, a light extraction efficiency is also improved by providing a reflective film for a pixel electrode or using a film for making a surface of a second interlayer insulating film higher as a reflective film. Therefore, in a small-sized display to be mounted into a mobile phone and the like, the effect that power consumption can be reduced is obtained in addition to the improvement of the yield.

Figure 15A:
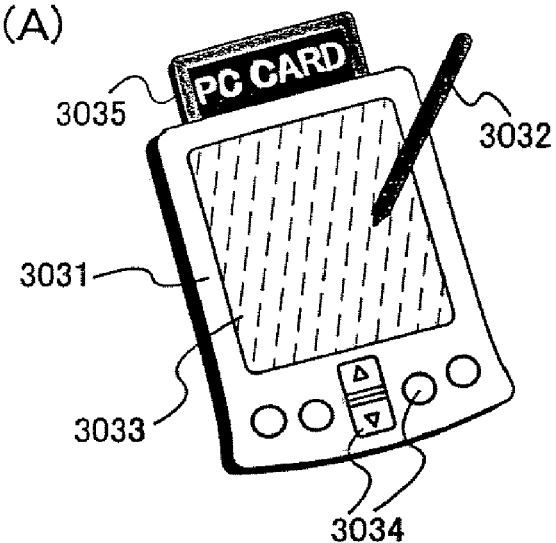
FIGS. 15A-15C are a diagram describing electronic device to which the present invention is applied.
Figure 15B:
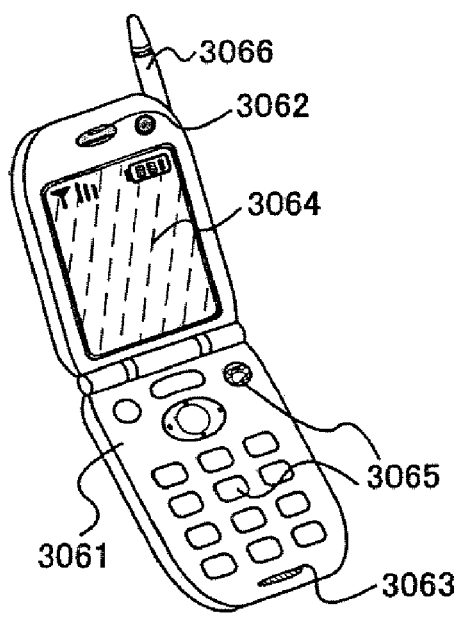

FIG. 15(A) is a personal digital assistance (PDA) manufactured with the present invention applied, which has a main body 3031 that has a display portion (an active matrix EL display to which the present invention is applied) 3033, an external interface 3035, operation buttons 3034, and the like provided. As an attachment for operations, there is a stylus 3032. FIG. 15(B) is a portable telephone manufactured with the present invention applied, which has a main body 3061 that has a display portion (an active matrix EL display to which the present invention is applied) 3064, a voice output portion 3062, a voice input portion 3063, operation switches 2905, an antenna 2906, and the like provided.

Figure 15C:
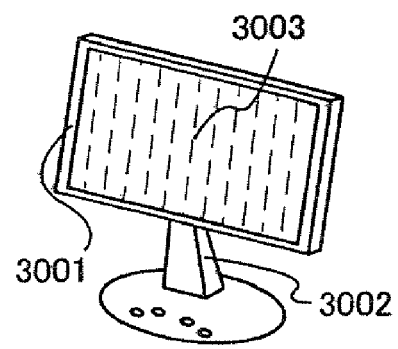

FIG. 15(C) is a monitor with the present invention applied, which has a display portion (an active matrix EL display to which the present invention is applied) 3003, a frame body 3001, a support 3002, and the like.

What is claimed is:

1. A method of manufacturing a light-emitting device, comprising:
    forming a first insulating film;
    forming a wire on the first insulating film;
    forming a second insulating film on the wire;
    locally planarizing a surface of the second insulating film to planarize at least an overlap portion of the second insulating film and the wire;
    forming an electrode of a light-emitting element on the second insulating film, wherein the electrode overlaps with the wire with the second insulating film interposed therebetween, and
    forming a partition layer comprising a third insulating film, wherein the partition layer includes an opening in an overlap portion of the electrode and the wire.

2. The method of manufacturing the light-emitting device according to claim 1, wherein a whole exposed portion of the electrode in the opening overlaps with the wiring.

3. The method of manufacturing the light-emitting device according to claim 1, wherein the surface of the second insulating film is locally planarized by Chemical Mechanical Polishing.

4. A method of manufacturing a light-emitting device, comprising:
    forming a semiconductor layer;
    forming a first insulating film over the semiconductor layer;
    forming a first and second wire on the first insulating film, wherein the first wire and the second wire are electrically connected to the semiconductor layer;
    forming a second insulating film on the first and second wire;
    locally planarizing a surface of the second insulating film to planarize at least an overlap portion of the second insulating film and the first and second wire;
    forming an electrode of a light-emitting element on the second insulating film, wherein the electrode overlaps with the first wire with the second insulating film interposed therebetween, and
    forming a partition layer comprising a third insulating film, wherein the partition layer includes an opening in an overlap portion of the electrode and the first wire.

5. The method of manufacturing the light-emitting device according to claim 4, wherein a whole exposed portion of the electrode in the opening overlaps with the first wiring.

6. The method of manufacturing the light-emitting device according to claim 4, wherein the surface of the second insulating film is locally planarized by Chemical Mechanical Polishing.

7. A method of manufacturing a light-emitting device, comprising:
    forming a semiconductor layer;
    forming a first insulating film over the semiconductor layer;
    planarizing a surface of the first insulating film;
    forming a first and second wire on the first insulating film, wherein the first wire and the second wire are electrically connected to the semiconductor layer;
    forming a second insulating film on the first and second wire;
    locally planarizing a surface of the second insulating film to planarize at least an overlap portion of the second insulating film and the first and second wire;
    forming an electrode of a light-emitting element on the second insulating film, wherein the electrode overlaps with the first wire with the second insulating film interposed therebetween, and
    forming a partition layer comprising a third insulating film, wherein the partition layer includes an opening in an overlap portion of the electrode and the first wire.

8. The method of manufacturing the light-emitting device according to claim 7, wherein a whole exposed portion of the electrode in the opening overlaps with the first wiring.

9. The method of manufacturing the light-emitting device according to claim 7, wherein the surface of the first insulating film is planarized by Chemical Mechanical Polishing.

10. The method of manufacturing the light-emitting device according to claim 7, wherein the surface of the second insulating film is locally planarized by Chemical Mechanical Polishing.

* * * * *